(12) United States Patent
Leuschner et al.

(10) Patent No.: US 9,490,834 B2
(45) Date of Patent: Nov. 8, 2016

(54) DIGITAL-TO-ANALOG CONVERTER CIRCUIT, AN APPARATUS FOR PROVIDING A RADIO FREQUENCY TRANSMIT SIGNAL AND A METHOD OF DIGITAL-TO-ANALOG CONVERSION

(71) Applicant: Intel IP Corporation, Santa Clara, CA (US)

(72) Inventors: Stephan Leuschner, Munich (DE); Michael Fulde, Weil (DE); Daniel Sira, Munich (DE); Gerhard Knoblinger, Villach (AT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/048,143

(22) Filed: Feb. 19, 2016

(65) Prior Publication Data
US 2016/0285470 A1 Sep. 29, 2016

(30) Foreign Application Priority Data
Mar. 27, 2015 (DE) ........................ 10 2015 104 814

(51) Int. Cl.
*H03M 1/66* (2006.01)
(52) U.S. Cl.
CPC ..................... *H03M 1/66* (2013.01)
(58) Field of Classification Search
CPC ...................................................... H03M 1/66
USPC ................................................ 341/144, 150
See application file for complete search history.

(56) References Cited

U.S. PATENT DOCUMENTS

| 7,589,659 | B2   |   | 9/2009  | Hurrell |              |
|-----------|------|---|---------|---------|--------------|
| 7,750,838 | B2   | * | 7/2010  | Krapf   | G01D 21/00   |
|           |      |   |         |         | 342/137      |
| 8,872,859 | B2   | * | 10/2014 | Ko      | G09G 3/3688  |
|           |      |   |         |         | 345/212      |
| 2006/0202929 | A1 | * | 9/2006  | Baum    | G09G 3/3648  |
|           |      |   |         |         | 345/89       |

OTHER PUBLICATIONS

Mohr, Bastian et al. "An RFDAC Based Reconfigurable Multistandard Transmitter in 65 nm CMOS." RMO2C-4. 2012 IEEE Radio Frequency Integrated Circuits Symposium. pp. 109-112.

* cited by examiner

*Primary Examiner* — Jean B Jeanglaude
(74) *Attorney, Agent, or Firm* — Eschweiler & Associates, LLC

(57) ABSTRACT

A digital-to-analog converter circuit including a plurality of digital-to-analog converter cells is provided. A first digital-to-analog converter cell of the plurality of digital-to-analog converter cells includes a cell control module configured to provide alternatingly a first voltage and a second voltage to a first electrode of a capacitive element of the first digital-to-analog converter cell based on a digital input signal during a predefined time interval. A second digital-to-analog converter cell of the plurality of digital-to-analog converter cells includes a cell control module configured to provide a third voltage to a first electrode of a capacitive element of the second digital-to-analog converter cell during the predefined time interval. The first voltage is higher than an upper threshold voltage corresponding to a first digital threshold level of the digital input signal and the second voltage is lower than a lower threshold voltage corresponding to a second digital threshold level of the digital input signal. The third voltage is constantly between the upper threshold voltage and the lower threshold voltage.

22 Claims, 12 Drawing Sheets

DIGITAL-TO-ANALOG CONVERTER CIRCUIT, AN APPARATUS FOR PROVIDING A RADIO FREQUENCY TRANSMIT SIGNAL AND A METHOD OF DIGITAL-TO-ANALOG CONVERSION

CROSS REFERENCE TO RELATED APPLICATIONS

This application claims priority to German Application number 10 2015 104 814.0, filed on Mar. 27, 2015, the contents of which are herein incorporated by reference in its entirety.

FIELD

Examples relate to the digital-to-analog conversion of electrical signals and in particular to a digital-to-analog converter circuit, an apparatus for providing a radio frequency transmit signal and a method of digital-to-analog conversion.

BACKGROUND

In mobile communication, a variety of different frequency bands is used for transmission and reception of radio frequency (RF) signals. Accordingly, a RF transceiver or a RF transmitter of a mobile communications device must be able to operate within these frequency bands, which places high demands to the RF transceiver or RF transmitter. For example, in 2014, a transceiver of a mobile communications device had to operate with frequencies between 704 MHz and 2690 MHz. For example, frequency bands 1, 2, 3, 5, 7, 8, 9, 11, 18, 19, 20, 21, 25, 26 and 28 used for Frequency Division Duplex (FDD) communication within the Long Term Evolution (LTE) system, frequency bands 38, 39, 40 and 41 used for Time Division Duplex (TDD) communication within the LTE system, frequency bands 34 and 39 used for Time Division Synchronous Code Division Multiple Access (TD-SCDMA) communication within the Universal Mobile Telecommunications System (UMTS) and frequency bands 1 to 6, 8, 9 and 19 used for Wideband Code Division Multiple Access (WCDMA) communication within UMTS had to be supported. Hence, the transceiver needs to cover a relative bandwidth of 117%. For example, in 2015, additional frequency bands 30, 42, 43, 10, 23, 24, 33, 35, 36, 37, 12, 13, 14, 17, 27, 44 and TV600 may be supported, so that a transceiver of a mobile communications device may be able to operate with frequencies between 570 MHz and 3800 MHz. Hence, the transceiver needs to cover a relative bandwidth of 148%. In future years, a further broadening of the frequency spectrum to be supported by a transceiver of a mobile communications device is expected. For example, a lower limit of the frequency spectrum may be shifted to 450 Mhz. Relative bandwidths of 150% and more may be expected.

Furthermore, RF transceivers may support carrier aggregation, i.e., the aggregation of two or more component carriers.

With available transceiver technology, an increasing number of transmission output stages including, e.g., Digital-to-Analog Converters (DAC) and inductance matching networks for RF applications, is necessary in a mobile communications device to cope with the above demands. Hence, an improved transmission stage may be desired.

BRIEF DESCRIPTION OF THE DRAWINGS

Some examples of apparatuses and/or methods will be described in the following by way of example only, and with reference to the accompanying figures, in which.

DETAILED DESCRIPTION

Figure 1:
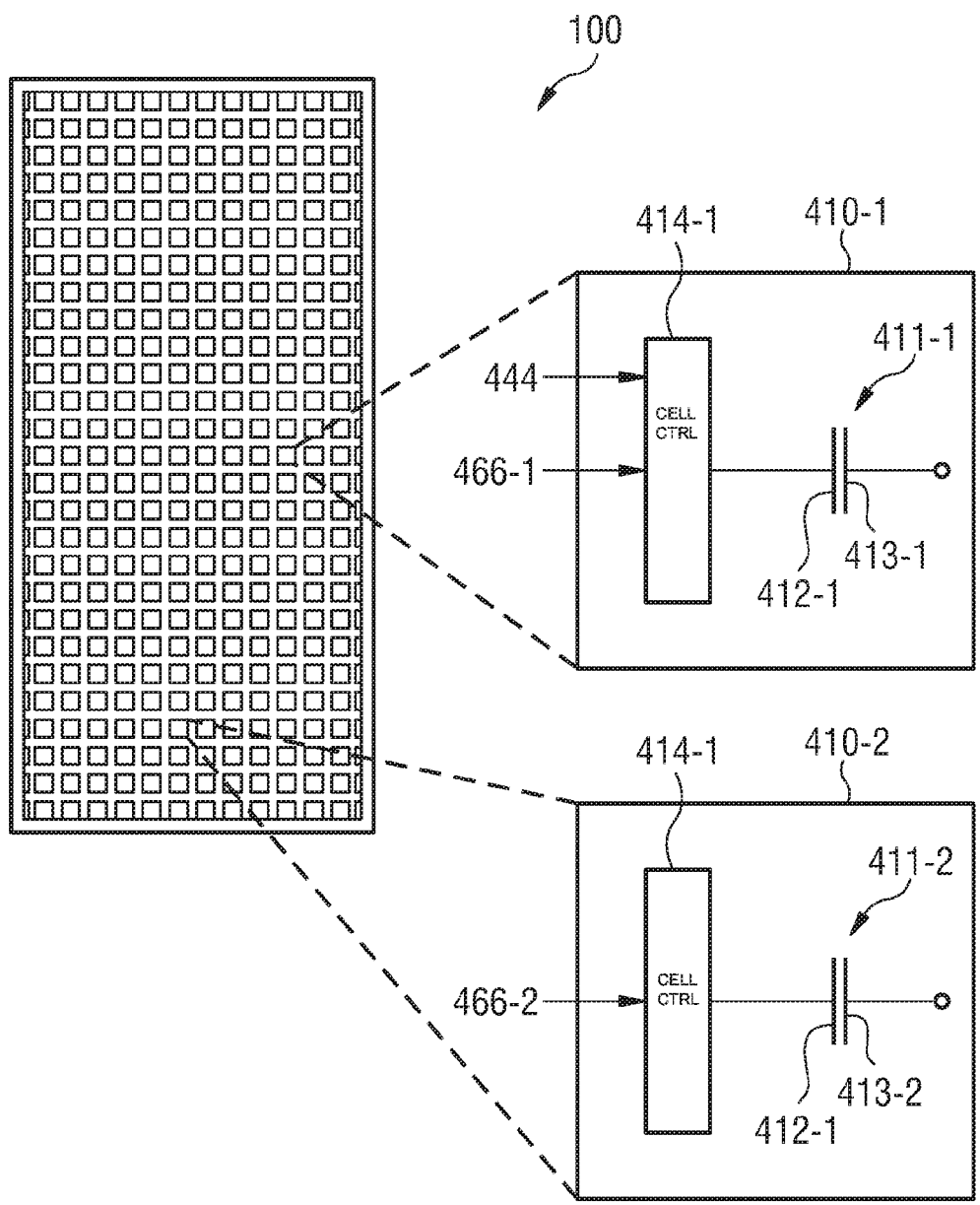
FIG. 1 illustrates an example of a digital-to-analog converter circuit.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some examples thereof are shown by way of example in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of further examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art, unless expressly defined otherwise herein.

In the following, various examples relate to devices (e.g. cell phone, base station) or components (e.g. transmitter, transceiver) of devices used in wireless or mobile communications systems. A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In these examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

FIG. 1 illustrates an example of a digital-to-analog converter circuit 100. The digital-to-analog converter circuit 100 comprises a plurality of digital-to-analog converter cells.

A first digital-to-analog converter cell 410-1 of the plurality of digital-to-analog converter cells comprises a cell control module 414-1 configured to provide alternatingly a first voltage and a second voltage to a first electrode 412-1 of a capacitive element 411-1 of the first digital-to-analog converter cell 410-1 based on a digital input signal 444 during a predefined time interval.

A second digital-to-analog converter cell 410-2 of the plurality of digital-to-analog converter cells comprises a cell control module 414-2 configured to provide a third voltage to a first electrode 412-2 of a capacitive element 411-2 of the second digital-to-analog converter cell 410-2 during the predefined time interval.

The first voltage is higher than an upper threshold voltage corresponding to a first digital threshold level of the digital input signal 444 and the second voltage is lower than a lower threshold voltage corresponding to a second digital threshold level of the digital input signal 444. The third voltage is constantly between the upper threshold voltage and the lower threshold voltage during the predefined time interval.

The cell control module 414-2 allows to provide constantly a voltage to the first electrode 412-2 which does not correspond to the two logic levels of the digital input signal 444 during the predefined time interval. For example, the third voltage provided to the first electrode 412-2 may be related to a high-impedance state of the cell control module 414-2. Accordingly, a capacitance of the capacitive element 411-2 may be effectively removed from the total capacitance of the digital-to-analog converter circuit 100, which may be the sum of the individual capacitances of the plurality of digital-to-analog converter cells. For example, the capacitance of the capacitive element 411-2 does not contribute to a total capacitance of the digital-to-analog converter circuit 100. Accordingly, a total capacitance of the digital-to-analog converter circuit 100 may be scaled by providing the third voltage to the first electrode 412-2 of the first digital-to-analog converter cell 410-2.

A voltage on the first electrode 412-2 of the capacitive element 411-2 of the first digital-to-analog converter cell 410-2 may in some examples not be to the third voltage during the predefined time interval. The voltage on the first electrode 412-2 of the capacitive element 411-2 of the first digital-to-analog converter cell 410-2 may further be influenced by a second electrode 413-2 of the capacitive element 411-2 of the first digital-to-analog converter cell 410-2. For example, the second electrode 413-2 may modify the voltage on the first electrode 412-2 based on an operation of one or more of the other digital-to-analog converter cells of the digital-to-analog converter circuit 100.

Each digital-to-analog converter cell of the plurality of digital-to-analog converter cells may provide an output signal based on a digital signal input to the digital-to-analog converter cell. The output signal may have analog signal characteristics. The first digital-to-analog converter cell 410-1 may be any cell of the plurality of digital-to-analog converter cells comprised in the digital-to-analog converter circuit 100. The second digital-to-analog converter cell 410-2 may be any cell except the first digital-to-analog converter cell 410-1 of the plurality of digital-to-analog converter cells comprised in the digital-to-analog converter circuit 100.

For example, the capacitive element 411-1 or the capacitive element 411-2 may be an on-chip capacitor (e.g. implemented within the metal layers or by trenches within the semiconductor substrate). However, the capacitive element 411-1 or the capacitive element 411-2 may also be any other suitable means for providing a capacitance.

The cell control module 414-1 and the control module 414-2 may, e.g., comprise one or more digital logic modules like an AND-gate, an OR-gate, a NAND-gate, a NOR-gate, NOT-gate and the like. The cell control module 414-1 and the control module 414-2 may optionally comprise further analog and/or digital circuitry. The one or more digital logic modules may, e.g., be combined in order control one or more switching means coupled to a respective voltage source. For example, the one or more digital logic modules may control the one or more switching means in order to provide the first voltage, the second voltage or the third voltage to the first electrode of the respective capacitive element 411-1 or 411-2 during the predefined time interval. The digital logic modules may be configured to switch the one or more switching means based on the digital input signal.

For example, a first digital level of the digital input signal 444 may be a logical high level and a second digital level of the digital input signal 444 may be a logical low level. The first digital threshold level of the digital input signal 444 may designate a voltage threshold which corresponds to the first digital level. If a signal voltage is above the first digital threshold level, it may be assumed that the signal indicates the first digital level. The second digital threshold level of the digital input signal 444 may designate a voltage threshold which corresponds to the second digital level. If a signal voltage is below the second digital threshold level, it may be assumed that the signal indicates the second digital level. For example, in a binary case, the first digital level may indicate "1" and the second digital level may indicate "0".

The first voltage is higher than an upper threshold voltage. The upper threshold voltage corresponds to the first digital threshold level of the digital input signal 444. In this way, the first digital-to-analog converter cell may output a voltage higher than the upper threshold voltage, if the digital input signal 444 comprises the first digital level (e.g. a logical 1). Further, the second voltage is lower than a lower threshold voltage. The lower threshold voltage corresponds to the second digital threshold level of the digital input signal 444. In this way, the first digital-to-analog converter cell may output a voltage lower than the lower threshold voltage, if the digital input signal 444 comprises the second digital level (e.g. a logical 0). The third voltage is constantly between the upper threshold voltage and the lower threshold voltage during the predefined time interval. In this way, the second digital-to-analog converter cell may be switched to a tristate mode and the contribution of the second digital-to-analog converter cell to the output capacitance of the digital-to-analog converter circuit 100 may be reduced.

Providing alternatingly the first voltage and the second voltage to the first electrode 412-1 of the capacitive element 411-1 of the first digital-to-analog converter cell 410-1 during the predefined time interval may comprise alternatingly providing the first voltage and the second voltage at least ten times to the first electrode 412-1 during the predefined time interval. In some examples, the first voltage and the second voltage may be provided alternatively at least 50 times, 100 times or more than 100 times to the first electrode 412-1 during the predefined time interval. In some embodiments, the first voltage and the second voltage may be provided oscillatory to the first electrode 412-1, so that alternatingly providing the first voltage and the second voltage to the first electrode 412-1 may comprise providing at least 10 oscillations to the first electrode 412-1 during the predefined time interval. Accordingly, providing less than 10 oscillations to the first electrode 412-1 during the predefined time interval may be regarded as providing constantly a voltage.

Some examples relate to a means for digital-to-analog conversion. The means for digital-to-analog conversion comprises a plurality of cellular means for digital-to-analog conversion. A first cellular means for digital-to-analog conversion of the plurality of cellular means for digital-to-analog conversion comprises a means for controlling the cell configured to provide alternatingly the first voltage and the second voltage to a first means for accumulation of charges of a means for providing a capacity of the first cellular means for digital-to-analog conversion based on a digital input signal during the predefined time interval. A second cellular means for digital-to-analog conversion of the plurality of cellular means for digital-to-analog conversion comprises a means for controlling the cell configured to provide the third voltage to a first means for accumulation of charges of a means for providing a capacity of the second cellular means for digital-to-analog conversion during the predefined time interval.

The cellular means for digital-to-analog conversion may be implemented by a digital-to-analog converter cell described above or below (e.g. FIG. 1). The means for controlling the cell may be implemented by a cell control module described above or below (e.g. FIG. 1). The first means for accumulation of charges and the second means for accumulation of charges may be implemented by an electrode, respectively, described above or below (e.g. FIG. 1). The means for providing a capacity may be implemented by a capacitive element described above or below (e.g. FIG. 1).

The digital-to-analog converter circuit may comprise one or more additional optional features corresponding to one or more aspects of the proposed concept or one or more examples described above or below.

The capacitive element 411-1 of the first digital-to-analog converter cell 410-1 may further comprise the second electrode 413-2 coupled to a common output node of the digital-to-analog converter circuit 100 and the capacitive element 411-2 of the second digital-to-analog converter cell 410-2 may further comprise a second electrode 413-2 connected to the common output node of the digital-to-analog converter circuit 100.

The cell control module 414-2 may provide the third voltage based on a digital tri-state control signal 466-2 indicating an activation of a tri-state mode. The digital tri-state control signal 466-2 may, e.g., be derived from a digital baseband transmit signal provided by a baseband processing unit connected to a transmission stage, a transmitter, a transceiver or more general an apparatus for providing an analog RF transmit signal which includes the digital-to-analog converter circuit 100. The digital baseband transmit signal may carry information to be transmitted. The digital tri-state control signal 466-2 (as well as respective digital tri-state control signals for the other digital-to-analog converter cells of the plurality of digital-to-analog converter cells) may, e.g., be derived from a desired carrier frequency for transmitting the digital baseband transmit signal.

The cell control module 414-2 (as well as the respective cell control modules of the other digital-to-analog converter cells of the plurality of digital-to-analog converter cells) may enable a tri-state logic. For example, the third voltage provided to the first electrode 412-2 may be related to a high-impedance state of the cell control module 414-2. For example, the cell control module 414-2 allows to provide constantly a voltage to the first electrode 412-2 which does not correspond to the two logic levels of the digital input signal 444. Accordingly, a capacitance of the capacitive element 411-2 may be effectively removed from the total capacitance of the digital-to-analog converter circuit 100, which is the sum of the individual capacitances of the plurality of digital-to-analog converter cells. For example, the capacitance of the capacitive element 411-2 does not contribute to the total capacitance of the digital-to-analog converter circuit 100. Accordingly, a total capacitance of the digital-to-analog converter circuit 100 may be scaled by providing the third voltage to the first electrode 412-2 of the digital-to-analog converter cell 410-2.

The control module 414-1 may provide the first voltage based on the digital input signal 444 indicating the first digital level and a digital tri-state control signal 466-1 indicating a de-activation of the tri-state-mode.

For example, the digital input signal 444 may be an oscillator signal of, e.g., a local oscillator module comprised in a transmission stage, a transmitter, a transceiver or an apparatus for providing an analog RF transmit signal. The phase of an oscillator signal generated by the local oscillator module may, e.g., be controlled by a phase component of a digital baseband transmit signal provided by a baseband processing unit. For example, the digital baseband transmit signal may be provided in a polar representation with an amplitude component signal and a phase component signal by the baseband processing unit. If the digital baseband transmit signal is provided in Cartesian representation, a polar coordinate provider, e.g., designed to execute a so-called CORDIC algorithm (COordinate Rotation DIgital Computer) in order to convert the Cartesian representation of the digital baseband transmit signal to the polar representation with amplitude component and phase component, may be provided in the transmission stage, transmitter, transceiver or apparatus for providing an analog RF transmit signal. The digital baseband transmit signal may carry information to be transmitted. The information may, e.g., be represented by one or more data values or data symbols. A symbol may be transmitted during a symbol time interval (e.g. a duration time of the symbol). A phase of the oscillator signal may be adapted for different symbol time intervals based on a sequence of symbols to be transmitted. In some examples, the predefined time interval may be the symbol time interval.

The cell control module 414-1 of the first digital-to-analog converter cell 410-1 allows to provide alternatingly voltages to the first electrode 412-1 which correspond to the two logic levels of the digital input signal 444 during the predefined time interval. For example, the alternatingly provided voltages may correspond to two logic levels, e.g., a high and a low level, of the oscillator signal. Accordingly, a voltage signal may be provided by the second electrode 413-1 of the first digital-to-analog converter cell 410-1 during the predefined time interval. The voltage signal may be related to a sequence of the two alternating logic levels in the digital input signal 444. For example, the second electrode 413-1 may provide a voltage signal which is related to the oscillator signal, e.g., an voltage signal may be provided by the second electrode 413-1 which is related to the phase component of the digital baseband transmit signal.

The other digital-to-analog converter cells 410 of the plurality of digital-to-analog converter cells may be structured and operated similar to or like one of the first and the second digital-to-analog converter cells 410-1 and 410-2.

A number of digital-to-analog converter cells providing alternatingly the first and the second voltage to the first electrodes of the respective capacitive element during the predefined time interval may be selected based on a digital amplitude control signal. The digital amplitude control signal may be related to the amplitude component of a digital baseband transmit signal. For example, the digital amplitude control signal may be provided to the digital-to-analog converter circuit by another module of the transmission stage, transmitter, transceiver or apparatus for providing an analog RF transmit signal including the digital-to-analog converter circuit. For example, the digital-to-analog converter circuit may comprise one or more modules for generating the digital amplitude control signal from, e.g., the amplitude component of the digital baseband transmit signal.

A number of digital-to-analog converter cells providing constantly the first voltage or the second voltage to the first electrodes of the respective capacitive element during the predefined time interval may be selected based on the digital amplitude control signal.

Selecting the number of digital-to-analog converter cells providing alternatingly the first and the second voltage to the first electrode and selecting number of digital-to-analog converter cells providing constantly the first voltage or the second voltage to the first electrode may allow to adjust the output voltage provided at the common output node of the digital-to-analog converter circuit. For example, the output voltage $V_{out}$ of the digital-to-analog converter circuit may be determined according to $$V_{out} = \frac{\sum C_{alt}}{C_{tot}} \cdot (V_{first} - V_{second}), \quad (1)$$

wherein $C_{tot}$ is the total capacitance of the plurality of digital-to-analog converter and $C_{alt}$ is the capacitance of a capacitive element which is provided alternatingly with the first voltage $V_{first}$ and the second voltage $V_{second}$.

As illustrated in FIG. 1, the plurality of digital-to-analog converter cells may be arranged in an array, e.g., in rows and columns. A row and/or a column decoder may be provided with the amplitude control signal to select a number of digital-to-analog converter cells in the columns and rows in which the first and the second voltage is provided alternatingly to the first electrode.

For example, a number of digital-to-analog converter cells providing constantly the third voltage to the first electrode may be selected based on a frequency of the oscillator signal (e.g., corresponding to a currently used carrier frequency). Accordingly, the total capacitance of the digital-to-analog converter circuit may be adjusted based on the frequency of the oscillator signal. For example, $C_{tot}$ in equation (1) may be not constant, but may vary with the number of digital-to-analog converter cells providing constantly the third voltage to the first electrode.

For example, a number of digital-to-analog converter cells providing the third voltage being constantly between the upper threshold voltage and the lower threshold voltage to the first electrodes of the respective capacitive element during the predefined time interval may depend on the frequency of the oscillator signal and/or an output power of the digital-to-analog converter circuit. For example, the number of digital-to-analog converter cells providing the third voltage to the first electrode may be lower for a first frequency of the oscillator signal which is lower compared to a second frequency of the oscillator signal. For example, the oscillator signal may comprise the first frequency during a first transmission time interval and the second frequency during a second transmission time interval. The first transmission time interval may be a time interval, where, e.g., the transmission stage, transmitter, transceiver or apparatus for providing an analog RF transmit signal which includes the digital-to-analog converter circuit transmits the RF transmit signal at a first transmit band. Accordingly, the second transmission time interval may be a time interval, where the RF transmit signal is transmitted at a second transmit band different from the first transmit band. For example, the first frequency may be a frequency within LTE frequency band 8 and the second frequency may be a frequency within LTE frequency band 22. For example, the frequency of the oscillator signal, e.g., the carrier frequency of the analog RF transmit signal provided at the common output node of the digital-to-analog converter circuit, may be controlled by the baseband processing unit.

In order maximize power transfer from the common output node of the digital-to-analog converter circuit to a coupled antenna element, an inductance presented to the common output node of the digital-to-analog converter circuit 100 may be optimized. The optimized inductance may allow to minimize signal reflection. One may determine the optimal inductance according to $$f = \frac{1}{2\pi\sqrt{LC}} \quad (2)$$

describing a relation between a resonance frequency f, an inductance L and a capacitance C of an LC circuit.

Regarding above equation (2), an optimal inductance presented to the common output node of the digital-to-analog converter circuit is related to the total capacitance of the digital-to-analog converter circuit and a frequency of the signal provided at the common output node of the digital-to-analog converter circuit. Hence, adjusting the total capacitance of the digital-to-analog converter circuit based on the frequency of the oscillator signal may allow to narrow a required value range for the inductance. For example, the transmission stage, transmitter, transceiver or apparatus for providing an analog RF transmit signal may include one digital-to-analog converter circuit and a matching circuit coupled to the digital-to-analog converter circuit in order to be able to provide analog RF transmit signals with frequencies between, e.g., 450 MHz and 3800 MHz. Hence, a number of transmission paths in a transmission stage may be reduced compared to, e.g., a transmitter with several transmit paths for different transmit bands.

For example, the bandwidth of capacitive RF DAC/switched-capacitor power amplifier may be increased by a scalable capacitor cell field with tri-state mode. By scaling the value of the total array capacitance, it may be possible to use the capacitive DAC itself as an adaptive tuning element. For different operating frequencies, the load impedance provided by the matching network may be optimum by choosing the appropriate tuning state in the capacitive DAC. For low frequencies, a relatively high total capacitance may be needed in order to resonate with the matching network presenting a certain inductance, while at higher frequencies for the same inductance value, the capacitance may be lower. In order to enable wideband operation for CAPDACs, the necessary range of inductance values may be reduced. By adopting a tri-state capable unit cell, the effective total capacitance of the CAPDAC's capacitor array presented to the matching network may be scaled. A CAPDAC with tri-state capable switched capacitor cells in order to scale the total array capacitance with the frequency may allow for wideband operation of the CAPDAC. In conjunction with a simple tunable matching network, covering the necessary frequency bands, a minimum of TX paths may be possible in a transmission stage, for example.

Figure 2:
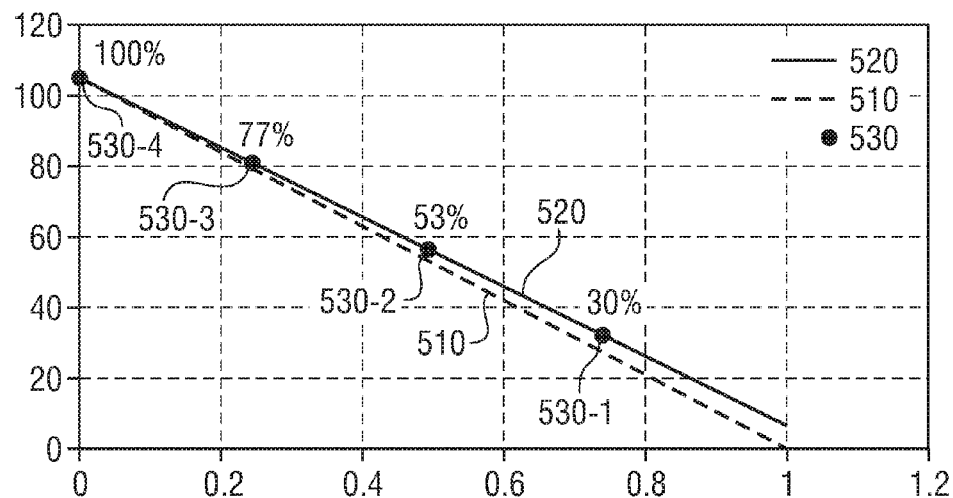
FIG. 2 illustrates an example of a relation between a total capacitance of the plurality of digital-to-analog converter cells comprised in an example of a digital-to-analog converter circuit and a proportion of capacitive elements to which first electrodes the third potential is provided.

FIG. 2 illustrates an example a relation between a total capacitance of the plurality of digital-to-analog converter cells comprised in an example of a digital-to-analog converter circuit (e.g., digital-to-analog converter circuit 100 illustrated in FIG. 1) and a proportion of capacitive elements the third potential is provided.

The abscissa denotes the proportion of capacitive elements among the plurality of digital-to-analog converter cells to which first electrode the third potential is provided. The ordinate denotes the total capacitance of the plurality of digital-to-analog converter cells, e.g., the total capacitance of the digital-to-analog converter circuit. In particular, the ordinate indicates a relative total capacitance of the digital-to-analog converter circuit with respect to the maximum total capacitance of the digital-to-analog converter circuit. The maximum total capacitance of the digital-to-analog converter circuit is achieved, if the third potential is not provided to the first electrode of any of the capacitive elements comprised in the plurality of digital-to-analog converter cells.

Line 510 illustrates an idealized scenario, where parasitic capacitances of the capacitive elements, the cell control modules or any wiring of the digital-to-analog converter circuit are neglected. As can be seen from line 510, the total capacitance of the digital-to-analog converter circuit is the maximum total capacitance, if the third potential is not provided to the first electrode of any of the capacitive elements comprised in the plurality of digital-to-analog converter cells. The total capacitance of the digital-to-analog converter circuit decreases linearly for an increasing number of capacitive elements to which first electrode the third potential is provided. If the third potential is provided to the first electrode of all of the capacitive elements comprised in the plurality of digital-to-analog converter cells, the total capacitance of the digital-to-analog converter circuit is zero. As can be seen from FIG. 2, the total capacitance of the plurality of digital-to-analog converter cells, e.g., the total capacitance of the digital-to-analog converter circuit, may be scaled linearly by providing the third voltage to first electrode of one or more capacitive elements included in the plurality of digital-to-analog converter cells.

Line 520 illustrates an example of a scenario, where parasitic capacitances within the digital-to-analog converter circuit are taken into account. As can be seen from line 520, the total capacitance of the digital-to-analog converter circuit may be scaled linearly. However, the minimum total capacitance of the digital-to-analog converter circuit is not zero due to the parasitic capacitances. By comparing lines 510 and 520, one may recognize that the total capacitance is slightly higher for the scenario represented by line 520 compared to the idealized scenario represented by line 510. However, scaling of the total capacitance of the digital-to-analog converter circuit from approx. 10% to 100% of its maximum total capacitance may be achieved for the scenario taking into account the parasitic capacitances. For example, the total capacitance of the digital-to-analog converter circuit may be scaled be by one order of magnitude.

For example, due to parasitic capacitances at both plates of the DAC unit capacitor, at the output of the inverter and due to wiring, the effective array capacitance may deviate from ideal scaling.

In the foregoing description, the plurality of digital-to-analog converter cells comprised a single capacitive element, respectively. However, e.g., the first digital-to-analog converter cell 410-1 may comprise at least one further capacitive element. The cell control module 414-1 of the first digital-to-analog converter cell 410-1 may be configured to either provide alternatingly the first and the second voltage to a first electrode of the further capacitive element or provide constantly the third voltage to the first electrode of the further capacitive element during the predefined time interval. Also the second digital-to-analog converter cell may comprise at least one more capacitive element. The cell control module 414-2 of the second digital-to-analog converter cell 410-2 may be configured to either provide alternatingly the first and the second voltage to a first electrode of the further capacitive element or provide constantly the third voltage to the first electrode of the further capacitive element during the predefined time interval.

In some examples, a number of capacitive elements provided alternatingly with the first and the second voltage may be equal for the first digital-to-analog converter cell 410-1 and the second digital-to-analog converter cell 410-2. In some examples, one or more other digital-to-analog converter cells of the plurality of digital-to-analog converter cells may comprise at least one further capacitive element, respectively.

Providing one or more further capacitive elements in the digital-to-analog converter cell may allow to increase a resolution of the digital-to-analog converter circuit. For example, the digital-to-analog converter circuit may be configured to convert a multi-bit digital baseband transmit signal to an analog signal. The number of bits present in the multi-bit digital baseband transmit signal may correspond to a number of discrete values between which the analog signal varies, for example. The greater the number of bits present, the larger the number of discrete values for the analog signal. For example, for a 5 Volt (V) system, i.e., a system where the first voltage is 5V and the second voltage is 0V, an eight bit digital baseband transmit signal may represent 256 (i.e., $2^8$) different voltage values; where voltage values range from a minimum of 0V to a maximum of 5V with 254 voltage steps in between. Each voltage step may be spaced at 5/255 V from neighboring voltage steps, for example. By varying the multi-bit digital baseband transmit signal supplied to the digital-to-analog converter circuit, signals output by the digital-to-analog converter circuit may vary in a piecewise continuous manner, and still be referred to as analog signals because of their analog character.

The digital-to-analog converter circuit may comprise, e.g., 256 digital-to-analog converter cells with one capacitive element each to be able to provide an output signal from 0V to 5V with 254 voltage steps in between. However, switching one of the digital-to-analog converter cells to the tri-state mode in order to adapt the total capacitance of the digital-to-analog converter circuit may reduce the resolution of the digital-to-analog converter circuit. Merely 255 digital-to-analog converter cells may be used for alternatingly providing the first voltage and the second voltage (or constantly providing the first or the second voltage) to the first electrode of the respective capacitive element during the predefined time interval. Hence, an output signal from 0V to 5V with merely 253 voltage steps in between may be provided, if one of the digital-to-analog converter cells is operated in tri-state mode.

Providing at least one further capacitive element in the digital-to-analog converter cells may allow to increase the resolution of the digital-to-analog converter circuit since more than one capacitive element in the digital-to-analog converter cell may be provided alternatingly with the first voltage and the second voltage (or constantly with the first or the second voltage). For example, providing one further capacitive element per digital-to-analog converter cell may allow to double the resolution. Providing two further capacitive elements per digital-to-analog converter cell may allow to triple the resolution. Providing three further capacitive elements per digital-to-analog converter cell may allow to quadruplicate the resolution. The capacitance of the individual capacitive elements may be adapted based on a desired maximum total capacitance of the plurality of digital-to-analog converter cells.

Continuing the above example, one or more of the further capacitive elements may be provided constantly with the third voltage during the predefined time interval in order to scale the total capacitance of the plurality of digital-to-analog converter cells, e.g., the total capacitance of the digital-to-analog converter circuit. However, the digital-to-analog converter circuit may allow to provide an output signal from 0V to 5V with at least 254 voltage steps in between since at least the respective first capacitive element of the plurality of digital-to-analog converter cells may be provided alternatingly with the first voltage and the second voltage (or constantly with the first or the second voltage).

Points 530 illustrated on line 520 of FIG. 2 illustrate an example, where a digital-to-analog converter cell of the plurality of digital-to-analog converter cells comprises in total four capacitive elements. Point 530-4 illustrates a situation where all of the four capacitive elements are provided alternatingly with the first voltage and the second voltage (or constantly with the first or the second voltage) during the predefined time interval. The total capacitance of the plurality of digital-to-analog converter cells is maximum, e.g., 100%. Point 530-3 illustrates a situation where three of the four capacitive elements are provided alternatingly with the first voltage and the second voltage (or constantly with the first or the second voltage) and one of the four capacitive elements is provided constantly with the third voltage during the predefined time interval. The total capacitance of the plurality of digital-to-analog converter cells is reduced, e.g., 77% of the maximum total capacitance. Point 530-2 illustrates a situation where two of the four capacitive elements are provided alternatingly with the first voltage and the second voltage (or constantly with the first or the second voltage) and two of the four capacitive elements are provided constantly with the third voltage during the predefined time interval. The total capacitance of the plurality of digital-to-analog converter cells is further reduced, e.g., to 53% of the maximum total capacitance. Point 530-2 illustrates a situation where one of the four capacitive elements is provided alternatingly with the first voltage and the second voltage (or constantly with the first or the second voltage) and three of the four capacitive elements are provided constantly with the third voltage during the predefined time interval. The total capacitance of the plurality of digital-to-analog converter cells is further reduced, e.g., 30% of the maximum total capacitance.

Points 530 illustrate a rather simple way to scale the total capacitance of the plurality of digital-to-analog converter cells while providing a constant resolution of the digital-to-analog converter circuit since the capacitance in all digital-to-analog converter cells of the plurality of digital-to-analog converter cells is reduced equally.

For example, scaling of the array capacitance by simply successively "tri-stating" more and more unit cells (digital-to-analog converter cells) may reduce a DAC resolution (in terms of quantization noise) when reducing the capacitance. For this reason, unit cells that are scalable in indiscrete steps may be used. Hence, the capacitance in all unit cells may be reduced concurrently while maintaining the resolution of the DAC. FIG. 2 shows an implementation of a CAPDAC using unit cells with four states: activating 1 . . . 4 sub-cells may yield—according to points 530 in FIG. 5—total capacitances of 30%, 53%, 77% and 100%.

In some examples, the third voltage may be provided to all capacitive elements in one or more digital-to-analog converter cells of the plurality of digital-to-analog converter cells. This may allow to increase the available scaling range for the total capacitance of the digital-to-analog converter circuit, although the resolution of the digital-to-analog converter circuit may be lowered, if all capacitive elements of a digital-to-analog converter cell are provided with the third voltage. In other words, one or more digital-to-analog converter cell may be deactivated to increase the available scaling range for the total capacitance of the digital-to-analog converter circuit.

For example, the first digital-to-analog converter cell may be assigned to a first cell row of the plurality of cell rows and a first cell column of the plurality of cell columns as, e.g., illustrated in FIG. 1. The second digital-to-analog converter cell may be assigned to a second cell row of the plurality of cell rows and a second cell column of the plurality of cell columns. The same digital tri-state control signal may be provided to all cells of the second cell row to control a tri-state mode of the digital-to-analog converter cells of the second cell row or to all cells of the second cell column to control a tri-state mode of the digital-to-analog converter cells of the second cell column. Hence, a same number of capacitive elements may be provided with the third voltage in each digital-to-analog converter cell assigned to the second cell row or the second cell column. In general, the same digital tri-state control signal may be provided to all digital-to-analog converter cells of a cell column or a cell row. For example, the total capacitance of the digital-to-analog converter circuit may be controlled cell row or cell column wise.

For example, if a transmission stage, a transmitter, a transceiver or an apparatus for providing an analog RF transmit signal includes the digital-to-analog converter circuit, one or more digital-to-analog converter cells of the plurality of digital-to-analog converter cells may be deactivated for generating analog RF transmit signals with a frequency in a noise tolerant frequency band. For example, LTE band 42 and 43 with frequencies between 3400 MHz and 3800 MHz may allow to switch certain digital-to-analog converter cells of the plurality of digital-to-analog converter cells to the tri-state mode.

However, further other examples are feasible. For example, the plurality of digital-to-analog converter cells may be grouped in quadrants or any other suitable sub-arrays and a same digital tri-state control signal may be provided to the quadrant or sub-array. Hence, controlling a total array capacitance of the digital-to-analog converter circuit may be facilitated since the same digital tri-state control signal may be provided to a plural digital-to-analog converter cells of the plurality of digital-to-analog converter cells.

In some examples, certain cells may be deactivated completely to enhance the effective capacitance tuning range (and sacrifice resolution) in certain bands where more TX noise can be tolerated (e.g. in TDD modes in bands 42 and 43 with frequencies between 3400 MHz and 3800 MHz.). For example, controlling the, e.g., 4 tri-state states for the sub-cells differently for each column in the array individually may allow to enhance to available capacitance tuning range. Completely deactivating parts of the cell field at the expense of cell field resolution may offer additional tunability for cases, where a reduction of number of bits is allowed, e.g., TDD at frequencies within 3400-3800 MHz.

Figure 3:
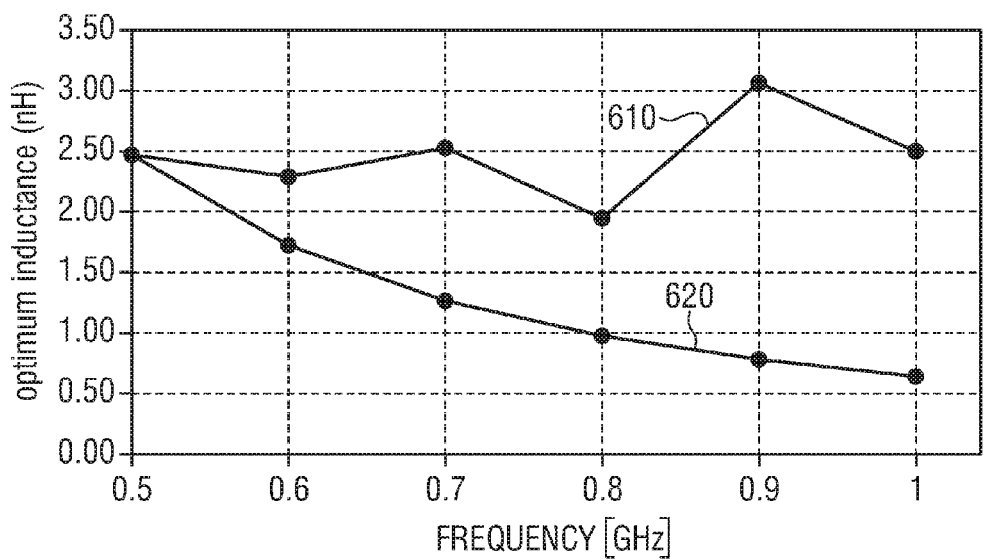
FIG. 3 illustrates a an example of a relation between an optimum inductance presented to an example of a digital-to-analog converter circuit and a frequency of a signal output by the example of a digital-to-analog converter circuit.

Line 610 in FIG. 3 illustrates an example of a relation between an optimum inductance presented by a matching circuit to an example of a digital-to-analog converter circuit and a frequency of the voltage signal output by the example of a digital-to-analog converter circuit. As a reference, line 620 illustrates an equivalent relation for a digital-to-analog converter circuit, i.e., a digital-to-analog converter circuit which is not able to set one or more of its capacitive elements to a tri-state mode.

Line 610 may represent a scenario where the digital input signal is an oscillator signal and the number of digital-to-analog converter cells of the plurality of digital-to-analog converter cells providing the third voltage to the first electrode during the predefined time interval is selected based on a frequency of the oscillator signal. For example, the total capacitance of the plurality of digital-to-analog converter cells, e.g., the total capacitance of the digital-to-analog converter circuit, may be adapted to the frequency of the oscillator signal. For example, the digital-to-analog converter circuit may be comprised in a transmitter or a transmission stage for providing an analog RF transmit signal based on a digital baseband transmit signal. Accordingly, the frequency of the oscillator signal may, e.g., be related to a desired carrier frequency of the analog RF transmit signal.

The abscissa denotes the frequency of the oscillator signal. A frequency range from 0 GHz to 1 GHz, e.g., low-band frequencies, is illustrated as example. The ordinate denotes the optimum impedance presented by a matching network coupled to the common output node of the digital-to-analog converter circuit in order to minimize signal reflection. Hence, power transfer from the digital-to-analog converter circuit to a coupled antenna element may be maximized. The optimum inductance may, e.g., be determined according to equation (2).

Figure 6:
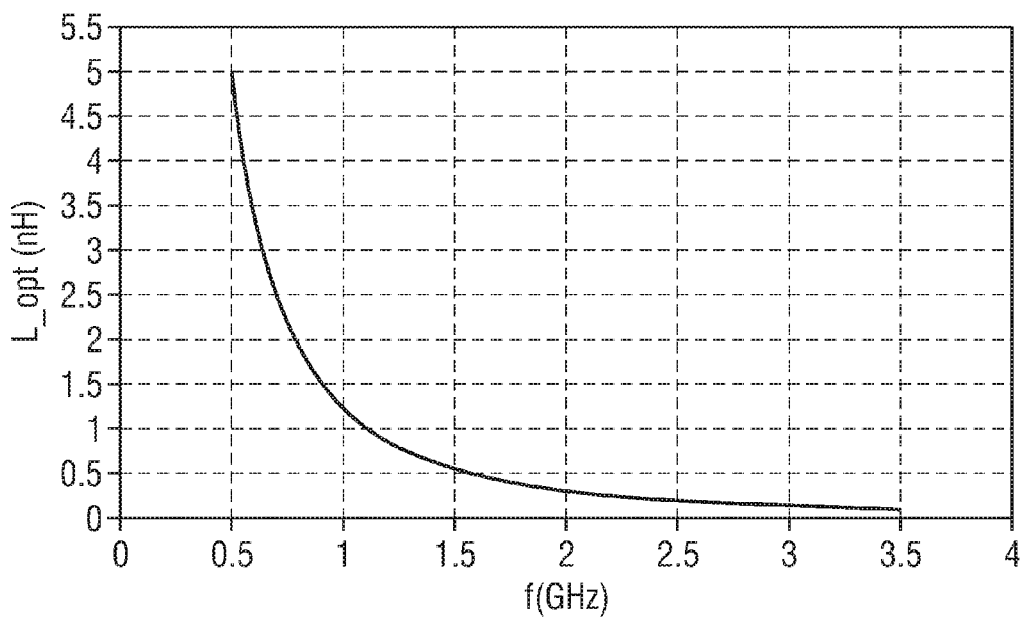
FIG. 6 illustrates an example a relation between an optimal inductance presented to a switched-capacitor RF DAC and a frequency of an analog signal output by the switched-capacitor RF DAC.

As indicated by line 610, the matching network may present inductance values between approx. 2 nano-Henry (nH) and 3 nH for the frequency range illustrated in FIG. 6. A maximum-to-minimum-inductance ratio is approx. 1.5. As a reference, line 620 indicates inductance values to be presented by the matching network to the conventional digital-to-analog converter circuit. For the given frequency range, inductance values between 2.5 nH and 0.6 nH may be presented to the conventional digital-to-analog converter circuit. A maximum-to-minimum-inductance ratio is approx. 5. For example, the matching circuit may need to present a much narrower inductance value range to the example of a digital-to-analog converter circuit compared to a conventional digital-to-analog converter circuit. Hence, the example of a digital-to-analog converter circuit may allow to pose lower requirements on the matching network compared to conventional digital-to-analog converter circuits. For example, lowering the requirements may allow to reduce insertion loss, i.e., loss of signal power resulting from the insertion of the matching circuit, and current consumption of the matching circuit.

For example, the scalable array of the digital-to-analog converter circuit may lead to a more constant value of the optimum inductance that has to be realized by the matching network. FIG. 3 illustrates an example of inductances values for different low-band frequencies: Without scaling of the capacitance, the maximum-to-minimum-inductance-ratio may be about 5 (maximum: 2.5 nH, minimum: 0.6 nH), while the tri-state unit cell array may demand values between 2 . . . 3 nH. This may lead to a reduced tuning range in the output matching network as the capacitor array itself may be considered as part of the tunable matching. Thus, less insertion loss and less current consumption may be achieved.

Figure 4:
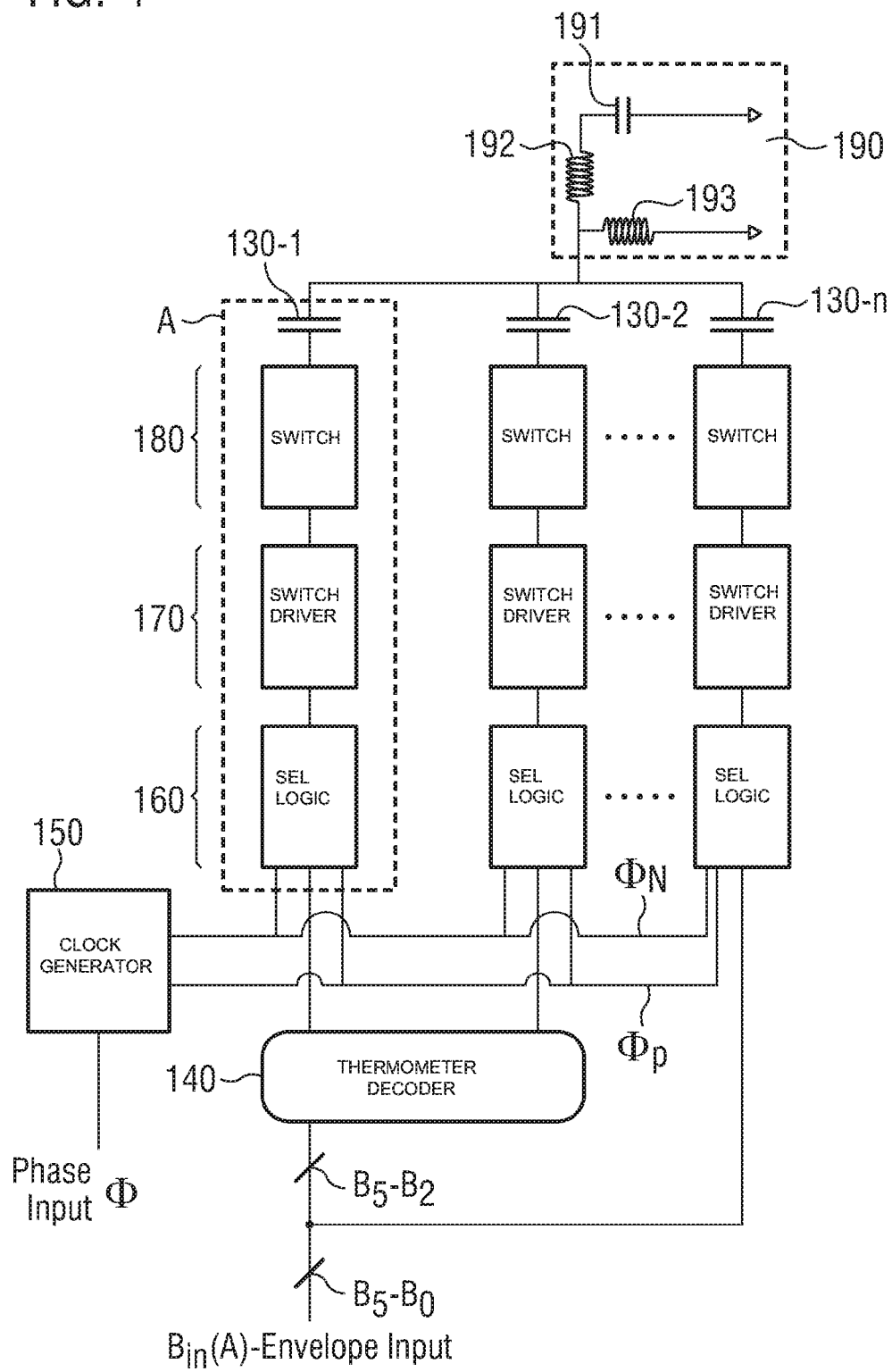
FIG. 4 illustrates an example of a switched-capacitor RF DAC and a connected inductance element.

FIG. 4 illustrates an example of switched-capacitor RF DAC 400 and an inductance element 190 for coupling the switched-capacitor RF DAC 400 to an antenna element (not illustrated).

The switched-capacitor RF DAC 400 comprises a plurality of capacitive elements 130-1, 130-2, . . . , 130-$n$. A first electrode of the plurality of capacitive elements 130-1, 130-2, . . . , 130-$n$ is controlled based on a phase component (PM) and a amplitude component (AM) of a digital baseband transmit signal.

The switched-capacitor RF DAC 400 may comprises a clock generator 150. The clock generator 150 may generate non-overlapping clock signals $\Phi_N$ and $\Phi_P$ related to a phase signal $\Phi$ a provided to the clock generator 150. For example, the phase signal $\Phi$ a may be the phase component of the digital baseband transmit signal which is modulated with a RF carrier signal. The clock generator 150 may, e.g., comprise a Local Oscillator (LO) which is controlled by the phase signal $\Phi$. The non-overlapping clock signals $\Phi_N$ and $\Phi_P$ are provided to a selection logic 160. The selection logic 160 may select one of the non-overlapping clock signals $\Phi_N$ and $\Phi_P$ and provides it to a switch driver 170.

The switched-capacitor RF DAC 400 may further comprise a binary-to-thermometer decoder 140. A digital binary code word $B_{in}(A)$ may be input to the binary-to-thermometer decoder 140. The digital binary code word $B_{in}(A)$ may represent the amplitude component of the digital baseband transmit signal. The binary-to-thermometer decoder 140 may provide a logic control signal $D_{in}$ based on information represented by the digital binary code word $B_{in}(A)$. For example, the information may be derived from a number of Most Significant Bits (MSB) of the digital binary code word $B_{in}(A)$.

For some capacitive elements of the capacitive elements 130-1, 130-2, . . . , 130-$n$, the selection logic 160 may provide the non-overlapping clock signals $\Phi_N$ and $\Phi_P$ to the switch driver 170 based on the control signal $D_{in}$ provided by the binary-to-thermometer decoder 140. For the other capacitive elements of the capacitive elements 130-1, 130-2, . . . , 130-$n$, the selection logic 160 may provide the non-overlapping clock signals $\Phi_N$ and $\Phi_P$ to the switch driver 170 based on a number of Least Significant Bits (LSB) of the digital binary code word $B_{in}(A)$.

The selection logic 160 further includes a tri-state control. The tri-state control may switch the capacitive element 130 to a tri-state mode. Hence, a capacitance of the capacitive element 130 may be effectively removed from the total capacitance of the plurality of capacitive elements 130-1, 130-2, . . . , 130-$n$. A total capacitance of the switched-capacitor RF DAC 400 may thus be scaled.

The switch driver 170 drives a switch 180. The switch 180 switches a capacitive element 130. Hence, the phase component of the digital baseband transmit signal may be used to generate an analog output voltage signal via the capacitive element 130. By combining the outputs of the plurality of capacitive elements 130-1, 130-2, . . . , 130-$n$, an analog RF transmit signal may be provided based on the digital baseband transmit signal by the switched-capacitor RF DAC 400.

The analog RF transmit signal may be provided to the inductance element 190. The inductance element 190 may ensure that an accurate or optimal inductance is presented to the output terminal of the switched-capacitor RF DAC 400. The inductance element 190 may increase an overall efficiency of a RF transmitter since a power transfer from the switched-capacitor RF DAC 400 to an antenna element may maximized due to minimized signal reflection. For example, the inductance element 190 may be an inductance matching circuit, which comprises, e.g., a capacitive element 191 and two inductive elements 192, 193. The inductance of the inductance element 190 may be adjusted to an overall capacitance of the switched-capacitor RF DAC 400. In particular, the inductance of the inductance element 190 may be adjustable over a defined range.

The switched-capacitor RF DAC may comprise one or more additional optional features corresponding to one or more aspects of the proposed concept or one or more examples described above or below.

Figure 5:
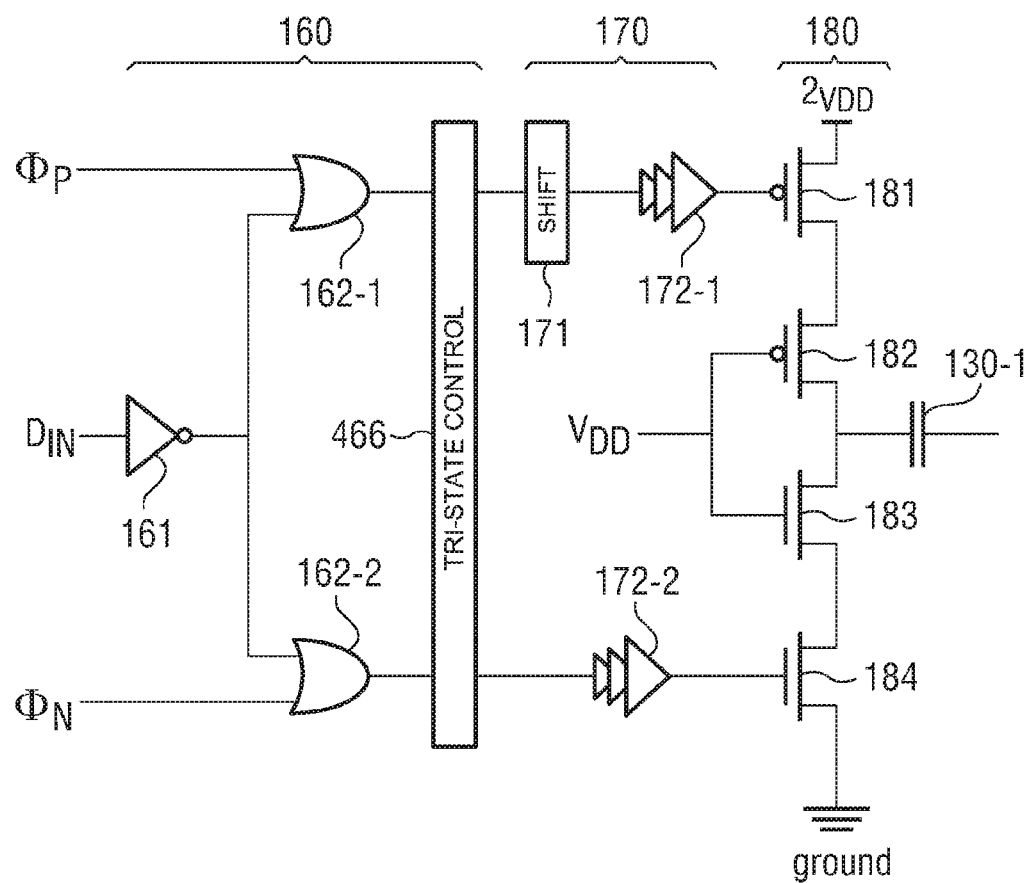
FIG. 5 illustrates a detailed view of section A of the switched-capacitor RF DAC illustrated in FIG. 4.

FIG. 5 illustrates a detailed view of section A of the switched-capacitor RF DAC 400 illustrated in FIG. 4. The selection logic 160 is comprised of two OR gates 162-1 and 162-2. The clock signal $\Phi_N$ is input to OR Gate 162-1 and the clock signal $\Phi_P$ is input to OR gate 162-2. Furthermore, the selection logic 160 comprises a NOT gate 161. The NOT gate 161 inverts the control signal $D_{in}$ and provides it to the OR gates 162-1 and 162-2. Based on the inverted control signal $D_{in}$, the non-overlapping clock signals $\Phi_N$ and $\Phi_P$ are provided to driver elements 172-1 and 172-2 of the switch driver 170.

The selection logic 160 further includes a tri-state control module 169. Based on the digital tri-state control 466 signal indicating an activation of a tri-state mode, the tri-state control may switch the capacitive element 130 to the tri-state mode. Hence, a capacitance of the capacitive element 130 may be effectively removed from the total capacitance of the plurality of capacitive elements 130-1, 130-2, ..., 130-n. A total capacitance of the switched-capacitor RF DAC 400 may thus be scaled. The tri-state control module 169 may forward the non-overlapping clock signals $\Phi_N$ and $\Phi_P$ to the driver elements 172-1 and 172-2 of the switch driver 170, if the digital tri-state control 466 signal indicates a de-activation of the tri-state mode. If the digital tri-state control 466 signal indicates an activation of the tri-state mode, the tri-state control module 169 may forward a tri-state signal to the driver elements 172-1 and 172-2 of the switch driver 170.

A level shifter 171 is provided to provide an adequate signal level to field effect transistor 181 of the switch 180.

The non-overlapping outputs of the driver elements 172-1 and 172-2 control the transistors 181, 184 of the switch 180. For example, the transistor 181 may be a p-type Metal-Oxide-Semiconductor Field-Effect Transistor (MOSFET) and the transistor 184 may be a n-type MOSFET. The transistor 181 is coupled to a potential $2V_{DD}$ and via another transistor 182 to the capacitive element 130. The other transistor 182 may, e.g., be a p-type MOSFET. The transistor 184 is coupled to a further potential, e.g., ground, and via another transistor 183 to the capacitive element 130. The other transistor 183 may, e.g., be a n-type MOSFET. The gates of the transistors 182 and 183 are coupled to a potential $V_{DD}$, respectively, so that the transistors 182 and 183 are in a conductive state. The transistors 181 and 184 are alternatingly switched to a conductive state by the non-overlapping clock signals $\Phi_P$ and $\Phi_N$ provided to the gates of the transistors 181 and 184, respectively. Consequently, the first electrode of the capacitive element 130 is either coupled to $2V_{DD}$ or ground. Hence, the transistors 181 and 184 allow to charge or discharge the first electrode of the capacitive element 130 based on the non-overlapping clock signals $\Phi_N$ and $\Phi_P$. Accordingly, the capacitive element 130 may provide a corresponding output voltage at its second electrode which oscillates with a frequency of the non-overlapping clock signals $\Phi_N$ and $\Phi_P$, e.g., a fraction of the analog RF transmit signal is provided at the second electrode of the capacitive element 130.

If the tri-state signal is provided to the driver elements 172-1 and 172-2, the driver elements 172-1 and 172-2 may switch the transistor 181 and the transistor 184 to a non-conductive state, respectively. Accordingly, the first electrode of the capacitive element 130 may be floating, so that the capacitance of the capacitive element 130 does not contribute to the total capacitance of the plurality of capacitive elements 130-1, 130-2, ..., 130-n.

The output voltage provided by the switched-capacitor RF DAC 400 may be calculated according to $$V_{out} = \frac{\sum C_{alt}}{C_{tot}} \cdot 2V_{DD}, \quad (3)$$

wherein $C_{tot}$ is the total capacitance of the plurality of capacitive elements 130-1, 130-2, ..., 130-n and $C_{alt}$ is the capacitance of a capacitive element 130-i which is switched between $2V_{DD}$ and ground. The total capacitance $C_{tot}$ may be scaled based on the number capacitive elements 130-1, 130-2, ..., 130-n switched to the tri-state mode. For example, $C_{tot}$ may be the sum of the capacitances of all capacitive element 130-i switched between $2V_{DD}$ and ground or held at either $2V_{DD}$ or ground. For example, capacitive elements switched to the tri-state mode do not contribute to the total capacitance $C_{tot}$.

The switched-capacitor RF DAC 400 may, e.g., be implemented in a Complementary Metal-Oxide-Semiconductor (CMOS) technology.

The switched-capacitor RF DAC may comprise one or more additional optional features corresponding to one or more aspects of the proposed concept or one or more examples described above or below.

FIG. 6 illustrates an example of a relation between an optimal inductance presented by the inductance element to a conventional switched-capacitor RF DAC and a frequency of an analog signal output by the conventional switched-capacitor RF DAC to the inductance element. The conventional switched-capacitor RF DAC is not able to switch a capacitance element to a tri-state mode. The optimal inductance may be determined according to above equation (2).

The total capacitance $C_{tot}$ of the conventional switched-capacitor RF DAC is a fixed value. For example, the capacitance of the conventional switched-capacitor RF DAC may be $C_{tot}$=20.48 pF. The relation between the optimal inductance $L_{opt}$ presented to the conventional switched-capacitor RF DAC by a matching circuit and a frequency f of the analog RF transmit signal output by the conventional switched-capacitor RF DAC is illustrated in FIG. 2 for the above example.

The abscissa denotes the frequency f and the ordinate denotes the optimal inductance $L_{opt}$. As can be seen from FIG. 2, the optimal inductance $L_{opt}$ varies from ~5 nH to ~100 pH within a frequency range from 500 MHz to 3500 MHz, which may be an operating range for a transmitter of a mobile communications device. Accordingly, an adjustable inductance element should be tunable by approximately two orders of magnitude to provide the optimal inductance to the conventional switched-capacitor RF DAC. However, this is not feasible with conventional semiconductor circuits. Accordingly, a plurality of transmission stages each including a conventional switched-capacitor RF DAC may be used to cover different frequency bands.

Figure 7:
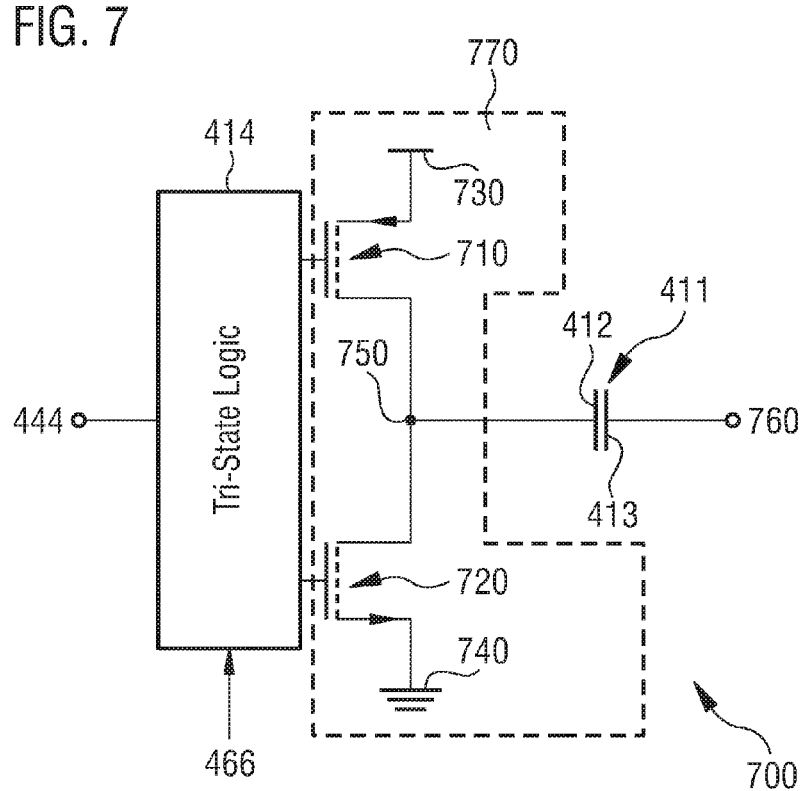
FIG. 7 illustrates an example of a digital-to-analog converter cell.

FIG. 7 illustrates an example 700 of a digital-to-analog converter cell. For example, the digital-to-analog converter cell 700 may be implemented in CMOS technology. However, the example is not limited thereto and various other technologies may be used for implementation.

The digital-to-analog converter cell 700 comprises a capacitive element 411. The capacitive element 411 comprises a first electrode 412 and a second electrode 413. The second electrode 413 may be connected to a common output node of the digital-to-analog converter circuit 700 via an output node 760 of the digital-to-analog converter cell 700.

The digital-to-analog converter cell 700 may comprise an inverter circuit 770. A first field effect transistor 710 and a second field effect transistor 720 of the inverter circuit 770 may be connected to an output node 750 of the inverter circuit. For example, the first field effect transistor 710 may be a p-type field effect transistor and the second field effect transistor 720 may be a n-type field effect transistor. A source of the first field effect transistor 710 may be connected to a first terminal 730. The first terminal 730 may be at a first potential, e.g., a positive voltage. A drain of the first field effect transistor 710 may be connected to the output node 750. A source of the second field effect transistor 720 may connected to a second terminal 740. The second terminal 740 may be at a second potential, e.g., ground. A drain of the second field effect transistor 720 may connected to the output node 750. The first electrode 412 of the capacitive element 411 may be coupled to the output node 750.

The gate of the first field effect transistor 710 and the gate of the second field effect transistor 720 may be connected to a cell control module 414. A digital input signal 444 and a digital tri-state control signal 466 may be provided to the cell control module 414. The cell control module may switch the first field effect transistor 710 and the second field effect transistor 720 based on the digital input signal 444 and the digital tri-state control signal 466.

The digital-to-analog converter cell may comprise one or more additional optional features corresponding to one or more aspects of the proposed concept or one or more examples described above or below.

Figure 8:
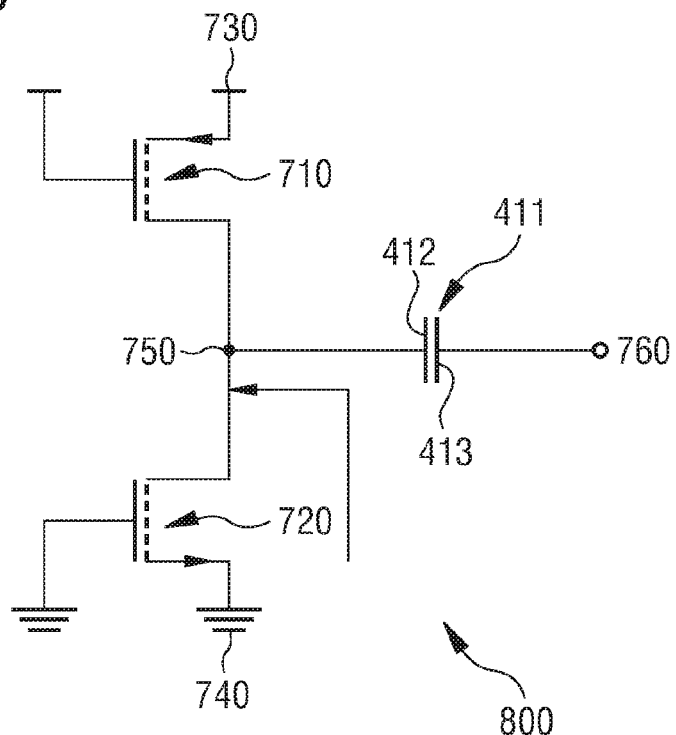
FIG. 8 illustrates an example of a digital-to-analog converter cell in a state where the third voltage is provided to the first electrode of the capacitive element.

FIG. 8 illustrates an example 800 of a digital-to-analog converter cell in a tri-state. For example, the digital-to-analog converter cell 800 may be implemented in CMOS technology. However, the example is not limited thereto and various other technologies may be used for implementation.

The cell control module 414 may keep the first field effect transistor 710 and the second field effect transistor 720 simultaneously at a non-conductive state to switch the digital-to-analog converter cell 700 in the tri-state mode. The cell control module 414 may keep the first field effect transistor 710 and the second field effect transistor 720 at the non-conductive state based on the digital tri-state control signal 466 indicating an activation of the tri-state mode. Therefore, the cell control module 414 may constantly provide a voltage to the gate of the first field effect transistor 710 which is equal or close to the voltage provided to the source of the first field effect transistor 710 by the first terminal 730. In particular, cell control module 414 may provide a voltage to the gate of the first field effect transistor 710 such that a gate-source voltage of the first field effect transistor 710 is below the threshold voltage of the first field effect transistor 710. The threshold voltage of a field effect transistor may be defined as the minimum gate-to-source voltage differential that is needed to create a conducting path between the source and drain of the field effect transistor. Further, the cell control module 414 may constantly provide a voltage to the gate of the second field effect transistor 720 which is equal or close to the voltage provided to the source of the second field effect transistor 720 by the second terminal 740. In particular, cell control module 414 may provide a voltage to the gate of the second field effect transistor 720 such that a gate-source voltage of the second field effect transistor 710 is below the threshold voltage of the second field effect transistor 710.

When both the first field effect transistor 710 and the second field effect transistor 720 are simultaneously at the non-conductive state, output node 750 may be floating, e.g., a high impedance state may be assumed at the output node 750. The digital-to-analog converter cell 700 is in the tri-state mode. Accordingly, a capacity of the capacitive element 411 may effectively not be seen by any other devices coupled to the digital-to-analog converter cell 700 via the cell output node 760. The tri-state mode may be used to scale a total capacitance of a digital-to-analog converter circuit comprising a plurality of the digital-to-analog converter cells 800.

The digital-to-analog converter cell may comprise one or more additional optional features corresponding to one or more aspects of the proposed concept or one or more examples described above or below.

Figure 9:
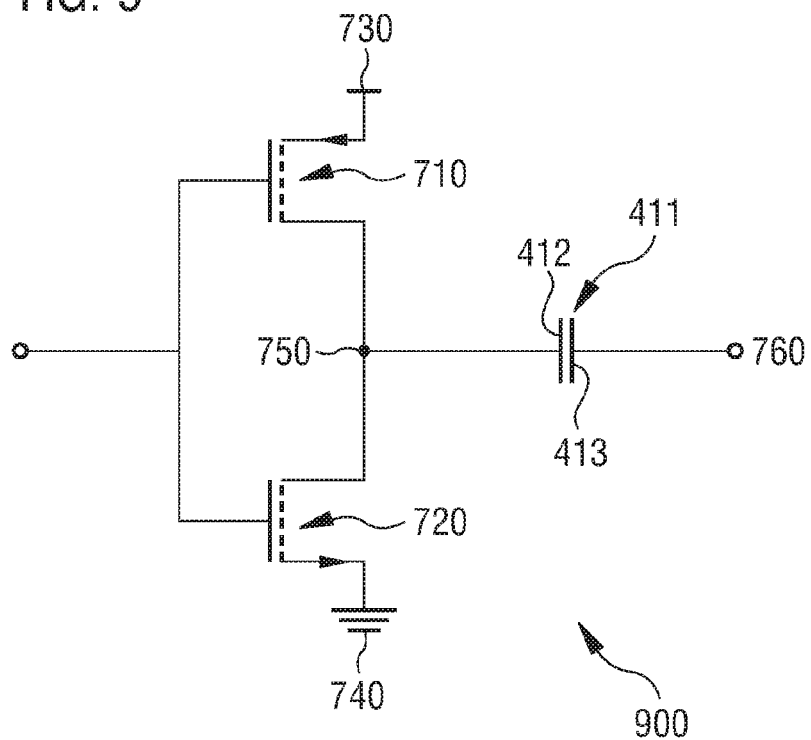
FIG. 9 illustrates an example of a digital-to-analog converter cell in a state where the first or the second voltage is provided to the first electrode of the capacitance.

FIG. 9 illustrates an example 900 of a digital-to-analog converter cell in an active state where either the first or the second potential is provided to the first electrode 412 of the capacitive element 411. For example, the digital-to-analog converter cell 900 may be implemented in CMOS technology. However, the example is not limited thereto and various other technologies may be used for implementation.

The cell control module 414 may provide a common voltage to the gate of the first field effect transistor 710 and the gate of the second field effect transistor 720 based on the digital input signal 444 indicating the first digital level or the second digital level and the digital tri-state control signal 466 indicating a de-activation of a tri-state-mode. For example, if the digital input signal 444 indicates the first digital level, a common voltage signal may be provided to the gate of the first field effect transistor 710 and the gate of the second field effect transistor 720 to switch the first field effect transistor 710 to the conductive state and the second field effect transistor 720 to the non-conductive state. Hence, the output node 750 may be connected to the first terminal 730. The potential of the first terminal 730 may be chosen such that the first voltage is provided to the first electrode 412, if the first field effect transistor 710 is at the conductive state. If the digital input signal 444 indicates the second digital level, a common voltage signal may be provided to the gate of the first field effect transistor 710 and the gate of the second field effect transistor 720 to switch the second field effect transistor 720 to the conductive state and the first field effect transistor 710 to the non-conductive state. Hence, the output node 750 may be connected to the second terminal 740. The potential of the second terminal 740 may be chosen such that the second voltage is provided to the first electrode 412, if the second field effect transistor 720 is at the conductive state. The cell control module may alternatingly or constantly switch one of the first field effect transistor 710 and the second field effect transistor 720 to the conductive state during the predefined time interval based on the digital input signal 444.

As discussed in connection with FIG. 8, the output node 750 and consequently also the cell output node 760 of the digital-to-analog converter cell 700 may be floating, if the first field effect transistor 710 and the second field effect transistor 720 are simultaneously at the non-conductive state. However, the output node 750 and the cell output node 760 are at an undefined potential or voltage. If the digital-to-analog converter cell 700 is connected to one or more other digital-to-analog converter cells 700, an output voltage of these digital-to-analog converter cell 700 may be applied via the capacitive element 411 to the drain of the first field effect transistor 710 and the drain of the second field effect transistor 720. If the voltage applied to the drain of the first field effect transistor 710 and the drain of the second field effect transistor 720 is too high, the drain junction of the first field effect transistor 710 and/or the drain junction of the second field effect transistor 720 may open up. Accordingly, the output node 750 should be kept at a defined lower potential in the tri-state mode to prevent the above described opening of the drain junctions of the first field effect transistor 710 and the second field effect transistor 720.

The digital-to-analog converter cell may comprise one or more additional optional features corresponding to one or more aspects of the proposed concept or one or more examples described above or below.

Figure 10:
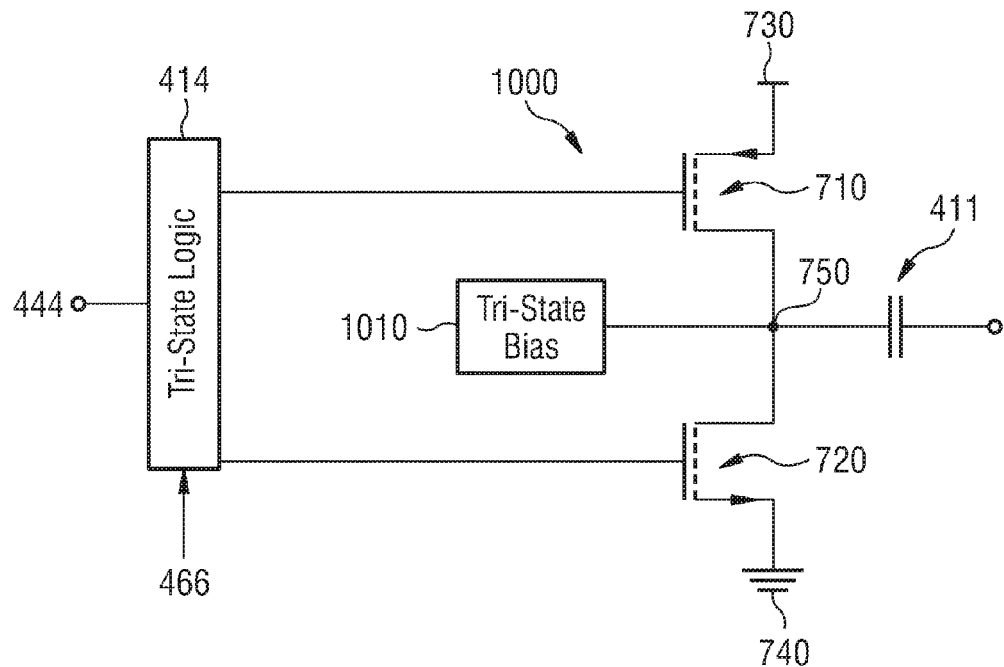
FIG. 10 illustrates an example of a digital-to-analog converter cell.

FIG. 10 illustrates an example 1000 of a digital-to-analog converter cell which may allow to prevent opening of the drain junctions of the first field effect transistor 710 and the second field effect transistor 720. For example, the digital-to-analog converter cell 1000 may be implemented in CMOS technology. However, the example is not limited thereto and various other technologies may be used for implementation.

The digital-to-analog converter cell 1000 may comprise least one bias module 1010 to bias the output node 750 of the inverter circuit 770 to the third voltage, if the at least two field effect transistors 710, 720 are simultaneously in the non-conductive state. In other words, the bias module 1010 may pull a voltage of the output node 750 to a desired bias voltage, if the digital-to-analog converter cell 1000 is in the tri-state mode. The output node 750 of the inverter circuit 770 may be regarded as an intermediate node of the digital-to-analog converter cell 1000. The bias module 1010 may have a resistance which is lower than the resistance of each of the two field effect transistors 710, 720 in the non-conductive state and higher than the resistance of each of the two field effect transistors 710, 720 in the conductive state.

The third voltage may be selected such that the drain junction of the first field effect transistor 710 and the drain junction of the second field effect transistor 720 does not open up. For example, the third voltage may be half of the first voltage, or may be centred between the first voltage and the second voltage.

The resistance of the bias element 1010 may be chosen high enough that the bias element 1010 does not influence high-frequency properties of the digital-to-analog converter cell 1000. In some examples, a time constant of the resistance of the digital-to-analog converter cell 1000 and the capacitance of the digital-to-analog converter cell 1000, e.g., the capacitance of the capacitive element 411, may be ten times higher than an operation frequency, e.g., a frequency for alternatingly providing the first voltage and the second voltage to the first electrode of the capacitive element 411. For example, the operating frequency may be f=2 GHz and the capacitance of the digital-to-analog converter cell 1000 may be C=30 fF and the resistance of the bias element 1010 may be determined according to $$R = 10 * \frac{1}{2\pi f C}. \qquad (4)$$

For example, R~26 kΩ (kilo-Ohm) for the above example. Moreover, the resistance of the bias element 1010 may be chosen low enough that an influence of leakage currents of the first field effect transistor 710 and the second field effect transistor 720 on the voltage at the output node 750 is minimized. For example, one tenth of the effective leakage resistance of the first field effect transistor 710 and the second field effect transistor 720 may be chosen as upper limit for the resistance of the bias element 1010. For example, if the effective leakage resistance of the first field effect transistor 710 and the second field effect transistor 720 is 1 MΩ, the resistance of the bias element 1010 may be smaller than 100 kΩ.

In other words, when both transistors are switched off, as shown in FIG. 8, the output node may be floating (a wanted property), but undefined (unwanted). The capacitor in each cell operating in this tristate mode may feed through parts of the CAPDAC output voltage. This may lead the transistors drain junctions to open up. To prevent this, the drain nodes may be biased to, e.g., half of the first voltage.

More details and aspects of the digital-to-analog converter cell 1000 are mentioned in connection with the proposed concept or one or more examples described above or below (e.g. FIGS. 1-9 and 10-19). The digital-to-analog converter cell 1000 may comprise one or more additional optional features corresponding to one or more aspects of the proposed concept or one or more examples described above or below.

Some examples relate to a means for digital-to-analog conversion. The means for digital-to-analog conversion comprises a plurality of cellular means for digital-to-analog conversion. A cellular means for digital-to-analog conversion of the plurality of cellular means for digital-to-analog conversion comprises a means for controlling connected to a means for switch control of a first means for switching and a means for switch control of a second means for switching. The first means for switching and the second means for switching are connected to a means for providing an intermediate node of the means for controlling. The means for controlling is configured to keep the first means for switching and the second means for switching simultaneously at a non-conductive state to switch the cellular means for digital-to-analog conversion to a tri-state mode. The means for digital-to-analog conversion further comprises a means for biasing coupled to the means for providing an intermediate node. The means for biasing is configured to pull a voltage of the means for providing an intermediate node to a desired bias voltage, if the cellular means for digital-to-analog conversion is in the tri-state mode.

The cellular means for digital-to-analog conversion may be implemented by a digital-to-analog converter cell described above or below (e.g. FIG. 10). The means for controlling the cell may be implemented by a cell control module described above or below (e.g. FIG. 10). The first second means for switching and the second means for switching may be implemented by a field effect transistor, respectively, described above or below (e.g. FIG. 10). The means for switch control may be implemented by a gate of the field effect transistor described above or below (e.g. FIG. 10). The means for providing an intermediate node may be implemented by an output node or an intermediate node described above or below (e.g. FIG. 10). The means for biasing may be implemented by a bias element described above or below (e.g. FIG. 10).

Some examples relate to a digital-to-analog converter circuit comprising a plurality of digital-to-analog converter cells. A digital-to-analog converter cell 1000 of the plurality of digital-to-analog converter cells comprises a cell control module 414 connected to the gate of the first field effect transistor 710 and the gate of the second field effect transistor 720. The first field effect transistor 710 and the second field effect transistor 720 are connected to an intermediate node 750 of the digital-to-analog converter cell 1000. The cell control module 414 may keep the first field effect transistor 710 and the second field effect transistor 720 simultaneously at a non-conductive state to switch the digital-to-analog converter cell 1000 to a tri-state mode. The digital-to-analog converter cell 1000 may further comprise a bias module 1010 coupled to the intermediate node 750 of the digital-to-analog converter cell 1000. The bias module 1010 may pull a voltage of the intermediate node to a desired bias voltage, if the digital-to-analog converter cell 1000 is in the tri-state mode.

The digital-to-analog converter cell may comprise one or more additional optional features corresponding to one or more aspects of the proposed concept or one or more examples described above or below.

Figure 11:
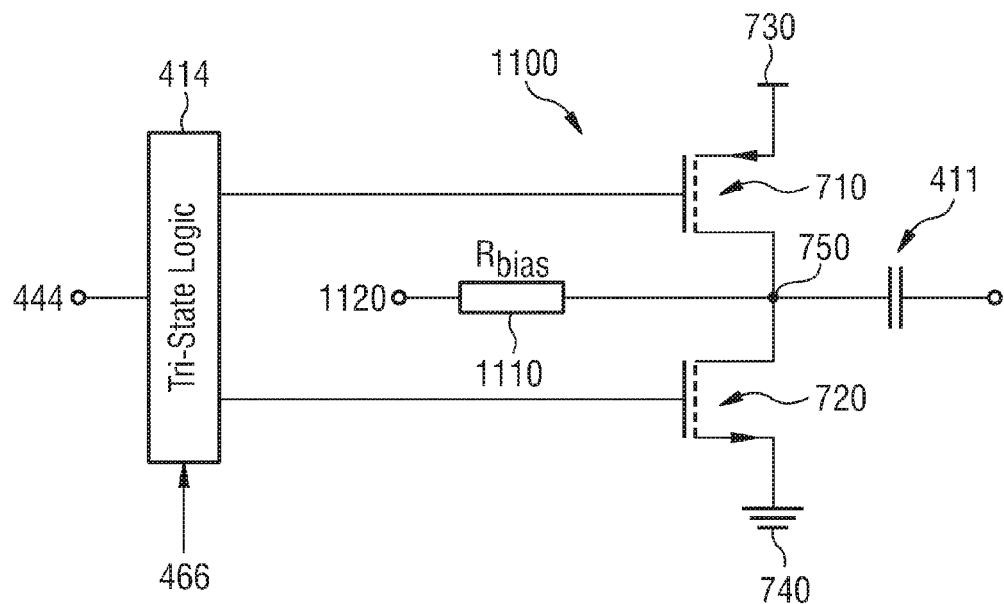
FIG. 11 illustrates an example of a digital-to-analog converter cell.

FIG. 11 illustrates an example 1100 for a digital-to-analog converter cell. For example, the digital-to-analog converter cell 1100 may be implemented in CMOS technology. However, the example is not limited thereto and various other technologies may be used for implementation.

For example, at least one resistor 1110 may be connected between a bias voltage source 1120 and the output node 750 of the inverter circuit 770. The resistance of the resistor 1110 and the voltage of the bias voltage source 1120 may be selected such that the third voltage is provided to the output node 750, if the at least two field effect transistors 710, 720 are simultaneously in the non-conductive state. For example, using at least one resistor to apply the necessary bias voltage may be a simple implementation.

The digital-to-analog converter cell may comprise one or more additional optional features corresponding to one or more aspects of the proposed concept or one or more examples described above or below.

Figure 12:
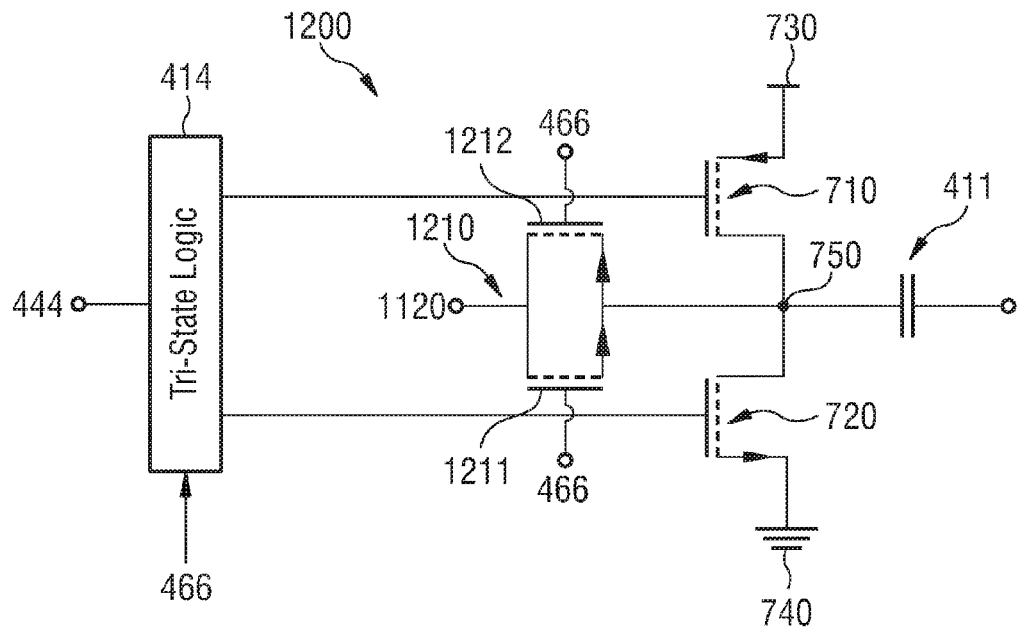
FIG. 12 illustrates an example of a digital-to-analog converter cell.

FIG. 12 illustrates an example 1200 of a digital-to-analog converter cell. For example, the digital-to-analog converter cell 1200 may be implemented in CMOS technology. However, the example is not limited thereto and various other technologies may be used for implementation.

For example, a transmission gate 1210 may be used to bias the output node 750 of the inverter circuit. The transmission gate 1210 may comprise at least two field effect transistors 1211, 1212. For example, the field effect transistor 1211 may be a n-type field effect transistor and the field effect transistor 1212 may be a p-type field effect transistor. A drain of the field effect transistor 1211 may be connected to a drain of the field effect transistor 1212 and the bias voltage source 1120. A source of the field effect transistor 1211 may be connected to a source of the field effect transistor 1212 and the output node 750. For example, the digital tri-state control signal 466 may be provided to a gate of the field effect transistor 1211. A signal 466' related to the digital tri-state control signal 466 may be provided to a gate of the field effect transistor 1212. For example, the signal 466' may be the inverted digital tri-state control signal 466. The signals 466 and 466' may switch the field effect transistors 1211, 1212 to a conductive state, if the digital tri-state control signal 466 indicates the activation of the tri-state mode.

The resistance of the transmission gate 1210 and the voltage of the bias voltage source 1120 may be selected such that the third voltage is provided to the output node 750, if the at least two field effect transistors 710, 720 are simultaneously in the non-conductive state. The field effect transistors 1211, 1212 may be selected to assure an accurate resistance of the transmission gate 1210.

The digital-to-analog converter cell may comprise one or more additional optional features corresponding to one or more aspects of the proposed concept or one or more examples described above or below.

Figure 13:
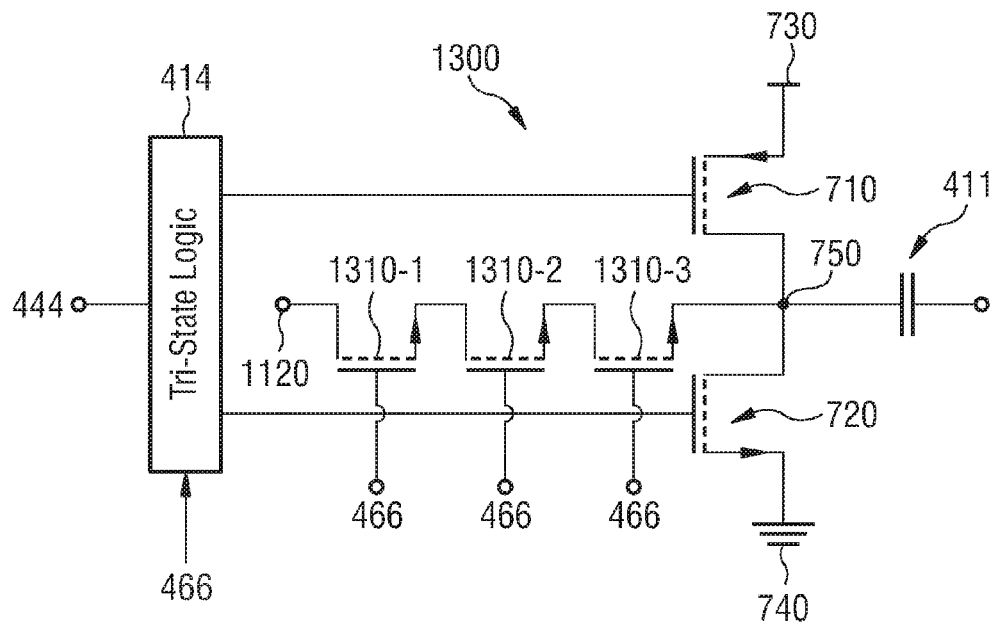
FIG. 13 illustrates an example of a digital-to-analog converter cell.

FIG. 13 illustrates an example 1300 a digital-to-analog converter cell. For example, the digital-to-analog converter cell 1300 may be implemented in CMOS technology. However, the example is not limited thereto and various other technologies may be used for implementation.

For example, at least one field effect transistor 1310 may be connected between the bias voltage source 1120 and the output node of the inverter circuit 750. The at least one field effect transistor 1310 may provide the third voltage, if the at least two field effect transistors 710, 720 are simultaneously in the non-conductive state. FIG. 13 illustrates a situation, where a plurality of serially connected field effect transistors 1310-1, 1310-2, 1310-3 is provided between the bias voltage source 1120 and the output node 750 of the inverter circuit 770. For example, the at least one field effect transistor 1310 may be a n-type field effect transistor or a p-type field effect transistor. For example, the digital tri-state control signal 466 may be provided to the gates of the field effect transistors 1310-1, 1310-2, 1310-3. The digital tri-state control signal 466 may switch the field effect transistors 1310-1, 1310-2, 1310-3 to a conductive state, if the digital tri-state control signal 466 indicates the activation of the tri-state mode.

The resistance of the at least one field effect transistor 1310 and the voltage of the bias voltage source 1120 may be selected such that the third voltage is provided to the output node 750, if the at least two field effect transistors 710, 720 are simultaneously in the non-conductive state. A number n of serially connected field effect transistors 1310 may be selected to assure an accurate total resistance of the plurality of field effect transistors.

The example 1200 and the example 1300 may allow to reduce a required area for a means for biasing the output node 750 on a semiconductor circuit compared to the example 1100. In other words, transmission gates (FIG. 12) or transfer transistors (FIG. 13) may be more area efficient solutions. However, also other implementations for the bias element 1010 may be possible.

The digital-to-analog converter cell may comprise one or more additional optional features corresponding to one or more aspects of the proposed concept or one or more examples described above or below.

Figure 14:
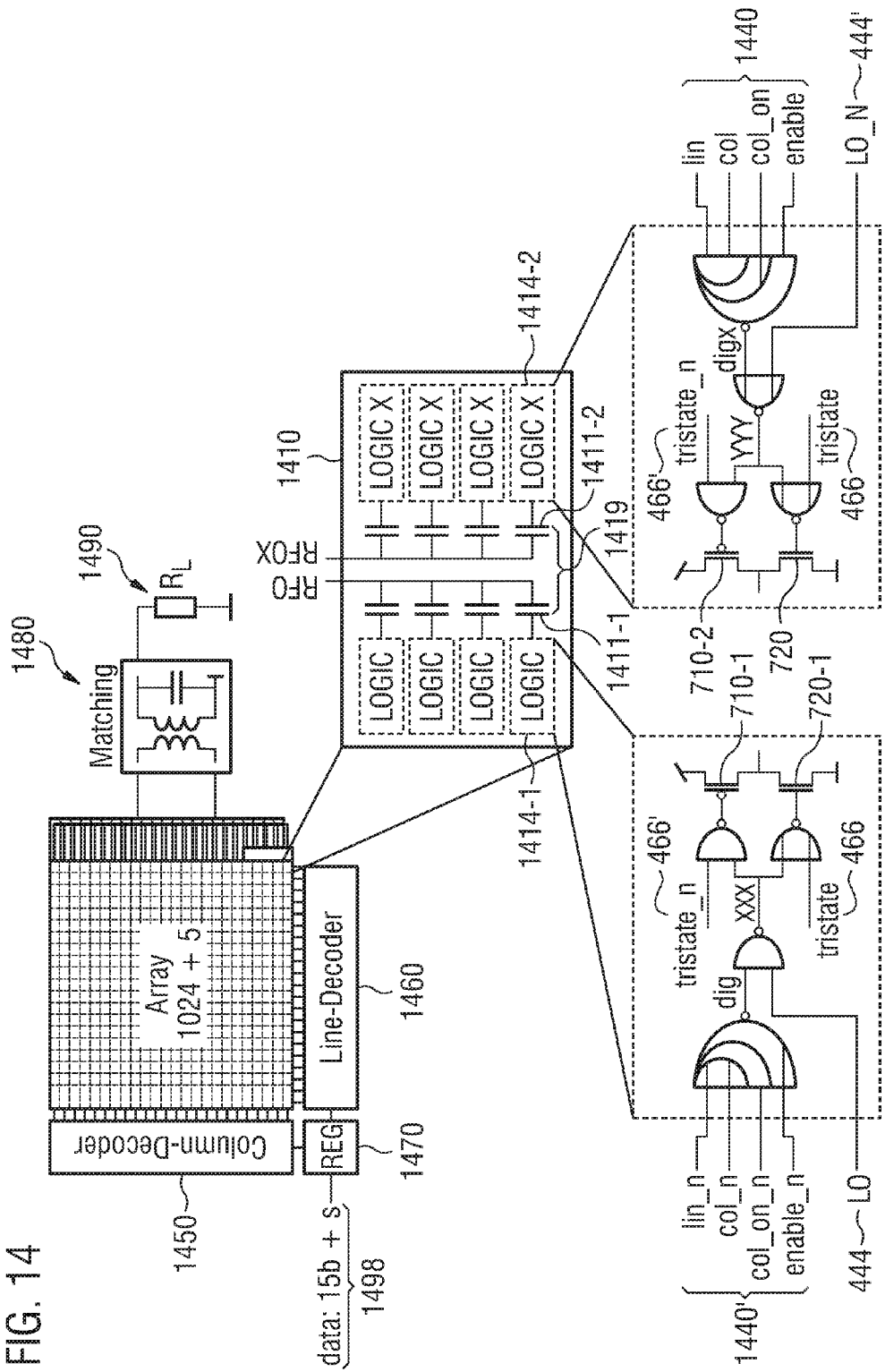
FIG. 14 illustrates another example of a digital-to-analog converter circuit.

FIG. 14 illustrates another example of a digital-to-analog converter circuit 1400. The digital-to-analog converter circuit 1400 comprises a plurality of digital-to-analog converter cells. The plurality of digital-to-analog converter cells may be arranged in array comprising several columns and rows. At least one digital-to-analog converter cell 1410 may comprise at least two capacitive elements 1411-1 and 1411-2. The two capacitive elements 1411-1, 1411-2 may form a differential capacitive element 1419. The cell control module of the digital-to-analog converter cell 1410 may provide the first voltage to the first electrode of one of the two capacitive elements 1411-1, 1411-2 of the differential capacitive element 1419 while providing the second voltage to the other of the two capacitive elements 1411-1, 1411-2 of the differential capacitance 1419. In some examples, the cell control module may comprise cell control sub-modules 1414-1, 1414-2 to provide the first voltage to the first electrode of one of the two capacitive elements 1411-1, 1411-2 of the differential capacitive element 1419 while providing the second voltage to the other of the two capacitive elements 1411-1, 1411-2 of the differential capacitive element 1419 during the predefined time interval. A differential voltage (e.g., RFO-RFOX) between the second electrodes of the two capacitive elements 1411-1, 1411-2 of the differential capacitive element 1419 may be provided as output of the differential capacitive element 1419. The cell control module of the digital-to-analog converter cell 1410 may further provide constantly the third voltage to the first electrode of the two capacitive elements 1411-1, 1411-2 of the differential capacitive element 1419 during the predefined time interval to switch the differential capacitive element 1419 in a tri-state mode.

A column-decoder 1450 may control a column operation of the plurality of digital-to-analog converter cells 1410. A row-decoder 1460 may control a row operation of the plurality of digital-to-analog converter cells 1410. A register 1470 may provide incoming digital data 1498 to the column-decoder 1450 and/or the row-decoder 1460. For example, the incoming data 1498 may be a digital baseband transmit signal.

The digital tri-state control signal 466 may be provided to the digital-to-analog converter cell 1410 by the column-decoder 1450 and/or the row-decoder 1460. For example, the column-decoder 1450 and/or the row-decoder 1460 may provide the digital tri-state control signal 466 based on information given in the incoming digital data 1498. The column-decoder 1450 and/or the row-decoder 1460 may, e.g., provide a separate digital tri-state control signal 466 for each digital-to-analog converter cell 1410. In some examples, the column-decoder 1450 and/or the row-decoder 1460 may provide a common digital tri-state control for a plurality of digital-to-analog converter cell 1410. For example, the column-decoder 1450 and/or the row-decoder 1460 may provide a common digital tri-state control for all digital-to-analog converter cells 1410 assigned to a same column or a same row. However, the digital-to-analog converter circuit 1400 may also comprise a separate module to provide the digital tri-state control signal 466 based on the incoming digital data 1498.

The incoming digital data 1498 may further comprise data related to the digital amplitude control signal. The column-decoder 1450 and/or the row-decoder 1460 may determine a number of digital-to-analog converter cells 1410 providing alternatingly the first voltage and the second voltage to the first electrode during the predefined time interval based on the digital amplitude control signal. The column-decoder 1450 and/or the row-decoder 1460 may provide one or more cell control signals 1440 to the cell control module of a digital-to-analog converter cell 1410. The cell control signal 1440 may, e.g., comprise signal components related to the individual cell and/or signal components related to multiple or all cells of a cell column (col, col_n, col_on, col_on_n) or a cell row (lin, lin_n, lin_on, lin_on_n). Hence, an amplitude of the voltage signal output by the digital-to-analog converter circuit 1400 may be controlled.

For the differential capacitive element 1419 illustrated in FIG. 14, the cell control sub-module 1414-1 for the first capacitive element 1411-1 may be provided with an inverted cell control signal 1440', the digital input signal 444, the digital tri-state control signal 466 and an inverted digital tri-state control signal 466'. The cell control sub-module 1414-2 for the second capacitive element 1411-2 may be provided with the cell control signal 1440, an inverted digital input signal 444', the digital tri-state control signal 466 and an inverted digital tri-state control signal 466'.

The cell control sub-module 1414-1 for the first capacitive element 1411-1 and the cell control sub-module 1414-2 for the second capacitive element 1411-2 may each comprise a plurality of logic gates to control the respective first field effect transistor 710-1, 710-2 and the respective field effect transistor 720-1, 720-2. Various implementations for the cell control sub-module 1414-1 for the first capacitive element 1411-1 and the cell control sub-module 1414-2 for the second capacitive element 1411-2 may be possible.

The signals tristate/tristate n may either switch off the first field effect transistor 710 and the second field effect transistor 720 (tristate=1) or let signals XXX & YYY pass through (tristate=0). The logic signals lin/col/col_on may process, e.g., thermometer coded, information coming from the column decoder 1450 and/or the row decoder 1460. The signals XXX & YYY may, e.g., enable/disable the respective digital-to-analog converter cell, e.g., by dig=(lin AND col) OR col_on. Implementing the decoder logic in a differential way as indicated in FIG. 14 using also negated logic signals lin_n/col_n/col_on_n may improve parasitic coupling from logic signals to the, e.g., RF, output of the differential capacitive element 1419.

In some examples, the digital-to-analog converter cell 1410 may comprise more than one differential capacitive element. For example, enable/enable_n signals may be used to enable/disable the different differential capacitive elements within one digital-to-analog converter cell 1410 individually. In some examples, these signals may be provided commonly for the whole array or differentiated for individual columns or lines to achieve a finer resolution.

The digital-to-analog converter circuit 1400 may be connected via a matching circuit 1480 to an antenna element 1490. The matching circuit 1480 may provide an adjustable inductance to the digital-to-analog converter circuit 1400 in order to enable the digital-to-analog converter circuit 1400 to resonate with the antenna element 1490.

The digital-to-analog converter circuit may comprise one or more additional optional features corresponding to one or more aspects of the proposed concept or one or more examples described above or below.

Figure 15:
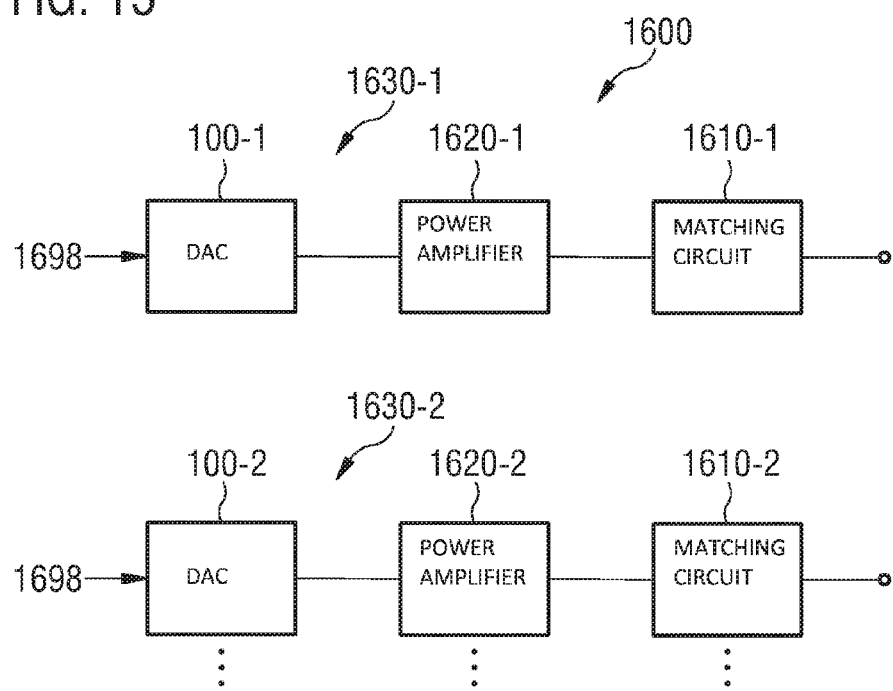
FIG. 15 illustrates an example of an apparatus for providing a RF transmit signal comprising an example of a digital-to-analog converter circuit.

FIG. 15 illustrates an example of an apparatus 1600 for providing a radio frequency transmit signal comprising at least one example of a digital-to-analog converter circuit 100 described herein. The apparatus 1600 may comprise a plurality of digital-to-analog converter circuits according to examples described herein. The plurality of digital-to-analog converter circuits may be comprised in a transmission path 1630-1, 1630-2, ..., respectively. The transmission paths 1630-1, 1630-2, ..., may be constituted of like elements or elements having a same functionality.

Digital-to-analog converter circuit 100-1 generates an analog radio frequency transmit signal based on a digital baseband transmit signal 1698 input to the digital-to-analog converter circuit 100-1. A matching circuit 1610-1 is coupled to the digital-to-analog converter circuit 100-1. The matching circuit 1610-1 may comprise one or more capacitive elements and one or more inductive elements. An inductance of the matching circuit 1610 presented to the digital-to-analog converter circuit 100-1 is adjustable. The matching circuit 1610-1 may present an optimal inductance to the digital-to-analog converter circuit 100-1, so that the digital-to-analog converter circuit 100-1 may resonate with an antenna element (not shown) coupled to the transmission path 1630-1. Hence, power transfer from the digital-to-analog converter circuit 100-1 to the antenna element may be maximized.

Optionally, the transmission path 1630-1 may comprise a power amplifier 1620-1 coupled between the common output node of the digital-to-analog converter circuit 100-1 and the matching circuit 1610-1. The power amplifier 1620-1 may amplify the radio frequency transmit signal and provide the amplified radio frequency transmit signal to the antenna element.

The digital-to-analog converter circuit 100-1 allows to scale its total capacitance. Accordingly, a necessary adjustable inductance range of the matching circuit 1610-1 may be comparatively low in order to enable the digital-to-analog converter circuit 100-1 to resonate with the antenna element coupled to the transmission path 1630-1. Hence, a frequency of the analog radio frequency transmit signal may lie within a broad frequency range. For example, the frequency range may be from 400 MHz to 3800 MHz. Compared to conventional transmitters using several transmission paths for the different transmit bands, the number of transmission paths may be reduced for apparatus 1600. Accordingly, a required area on a semiconductor circuit including the apparatus 1600 may be reduced compared to a semiconductor circuit including a conventional transmitter. Moreover, the saved area may on the semiconductor circuit be used to optimize the matching circuit 1610-1 in order to minimize insertion loss. Therefore, a current consumption of the apparatus 1600 may be reduced compared to a conventional transmitter.

In some examples, the apparatus 1600 may comprise a second digital-to-analog converter circuit 100-2. The first digital-to-analog converter circuit 100-1 may generate an analog radio frequency transmit signal having a carrier frequency within a first frequency range. The second digital-to-analog converter circuit 100-2 may generate an analog radio frequency transmit signal having a carrier frequency within a second frequency range. For example, the first frequency range may be from 400 MHz to 1200 MHz and the second frequency range may be from 1200 MHz to 3800 MHz. In some examples, the first frequency range may be from 400 MHz to 2000 MHz and the second frequency range may be from 2000 MHz to 3800 MHz. In some examples, the first frequency range may be from 400 MHz to 2300 MHz and the second frequency range may be from 2300 MHz to 3800 MHz. In some examples, the first frequency range may be from 400 MHz to 2700 MHz and the second frequency range may be from 2700 MHz to 3800 MHz. In some examples, the first frequency range may be from 400 MHz to 3400 MHz and the second frequency range may be from 3400 MHz to 3800 MHz.

The apparatus may comprise one or more additional optional features corresponding to one or more aspects of the proposed concept or one or more examples described above or below.

Figure 16:
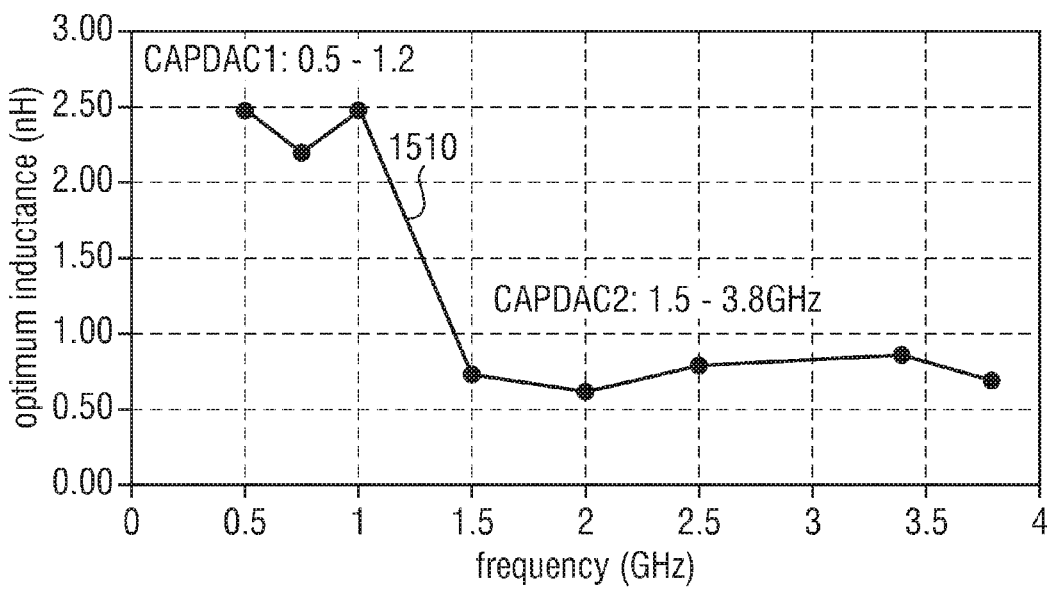
FIG. 16 illustrates an example of a relation between an optimal inductance presented to the examples of a digital-to-analog converter circuits and a carrier frequency of an analog radio frequency transmit signal output by the digital-to-analog converter circuits.

FIG. 16 illustrates an example of a relation between an optimal inductance presented to the a first example of a digital-to-analog converter circuit and a second example of a digital-to-analog converter circuit of an example of an apparatus for providing a radio frequency transmit signal and a carrier frequency of the analog radio frequency transmit signal output by the digital-to-analog converter circuits. For example, the first digital-to-analog converter circuit −1 may generate an analog radio frequency transmit signal having a carrier frequency within 500 MHz to 1200 MHz and the second digital-to-analog converter circuit −2 may generate an analog radio frequency transmit signal having a carrier frequency within 1500 MHz to 3800 MHz.

The abscissa denotes the carrier frequency of the analog radio frequency transmit signal output by the digital-to-analog converter circuits. A frequency range from 500 MHz to 3800 GHz, e.g. the complete LTE frequency spectrum, is illustrated as example. The ordinate denotes the optimum impedance presented by a first matching circuit and a second matching circuit to the respective digital-to-analog converter circuit in order to minimize signal reflection.

As indicated by line 1510, the first matching circuit may, e.g., present inductance values between approx. 1.7 nH and 2.5 nH to the first digital-to-analog converter circuit for the frequency range from 500 MHz to 1200 MHz. A maximum-to-minimum-inductance ratio is approx. 1.5. Line 1510 further indicates that the second matching circuit may, e.g., present inductance values between approx. 0.6 nH and 0.9 nH to the second digital-to-analog converter circuit for the frequency range from 1500 MHz to 3800 MHz. A maximum-to-minimum-inductance ratio is approx. 1.5. Hence, the first digital-to-analog converter circuit and the second digital-to-analog converter circuit may allow to pose lower requirements on the first matching circuit and the second matching circuit compared to conventional digital-to-analog converter circuits demanding, e.g., a maximum-to-minimum-inductance ratio of approx. 50-100 (see FIG. 6).

The first digital-to-analog converter circuit and the second digital-to-analog converter circuit may allow to generate an analog radio frequency transmit in all commercial frequency bands used for mobile communications. Compared to a conventional transmitter using several transmission paths for the different transmit band, a number of transmission paths may be reduced. For example, only two transmission stages 1630-1, 1630-2 may be used instead of, e.g., five or more transmission stages in conventional transmitters. Hence, a required area on a semiconductor circuit including the apparatus 1600 may be reduced compared to a conventional transmitter. Some of the saved area may be used to minimize insertion losses in order to reduce current consumption of the semiconductor circuit.

In other words, a CAPDAC with a switched capacitor array(s) consisting of unit cells having the three operation states ON/OFF/tri-state together with a tunable matching network may allow efficient wideband operation since the capacitor array may be part of the tuning circuitry. The number of transmission paths may be reduced. Tuning the array capacitance may reduce the tunability needs of the matching networks. Some of the saved area may be spent on improving the insertion loss of the matching networks and thus reduce current consumption. This may reduce insertion loss as well as current consumption. To efficiently cover all the LTE bands (570 MHz-3800 MHz), only two CAPDACs may be needed. This may result in an immense area reduction compared to standard implementation approaches.

An emerging approach for LTE communications is carrier aggregation, i.e., the aggregation of plural component carriers to attain an increased total transmission bandwidth. In approach is inter-band carrier aggregation, where component carriers in nearby frequency bands are aggregated. In order to allow any aggregation of component carriers in two different frequency bands, an example of an apparatus for providing a radio frequency transmit signal may comprise four transmission paths, e.g., each comprising an example of a digital-to-analog converter circuits. For example, two of the four digital-to-analog converter circuits may be used for lower frequency bands, e.g., from 400 MHz to 1200 MHz, and the other two digital-to-analog converter circuits may be used for higher frequency bands, e.g., from 1200 MHz to 3800 MHz. Hence, two component carriers in lower frequency bands or two component carriers in higher frequency bands may be aggregated. For example, component carriers in bands 5 and 12, 5 and 17, 1 and 21 or 2 and 4 may be aggregated. A conventional transmitter requires at least seven transmission paths, i.e., seven conventional switched-capacitor RF DACs, to allow any combination of component carriers. Therefore, a required area on a semiconductor circuit including an example of an apparatus for providing a radio frequency transmit signal may be reduced compared to a conventional transmitter. Some of the saved area may be used to minimize insertion losses in order to reduce current consumption of the semiconductor circuit.

In other words, for inter-band carrier aggregation (CA) of close bands (e.g., bands 5&12, 5&17, 1&21 or 2&4), which would require doubling the respective transmission paths, the area saving argument may become even stronger. Regarding conventional transmitters and the above band combinations, seven conventional CAPDACs would be necessary. Using the proposed wideband CAPDAC solution, only four CAPDACs may be sufficient to cover any 2xCA scenario.

A reduced number of digital-to-analog converter circuits compared to the conventional approach may further allow to reduce a length of a signal path for providing a local oscillator signal as the digital input signal 444 to the digital-to-analog converter circuits 400. Reducing the length of the signal path may further lower current consumption of the semiconductor circuit including an example of an apparatus 1600 for providing a radio frequency transmit signal.

In other words, reducing the number of CAPDACs may also reduce the necessary lengths for the local oscillator paths—providing further current saving potential compared to conventional approaches.

Some examples relate to a reconfigurable switched capacitor RF DAC/switched capacitor PA (power amplifier) for wide band operation.

Some examples relate to an implementation of the proposed concept in high volume architectures, in computer system architectures features and interfaces made in high volumes, may encompass IA (integrated architectures), devices (e.g. transistors) and associated manufacturing (mfg) processes.

Figure 17:
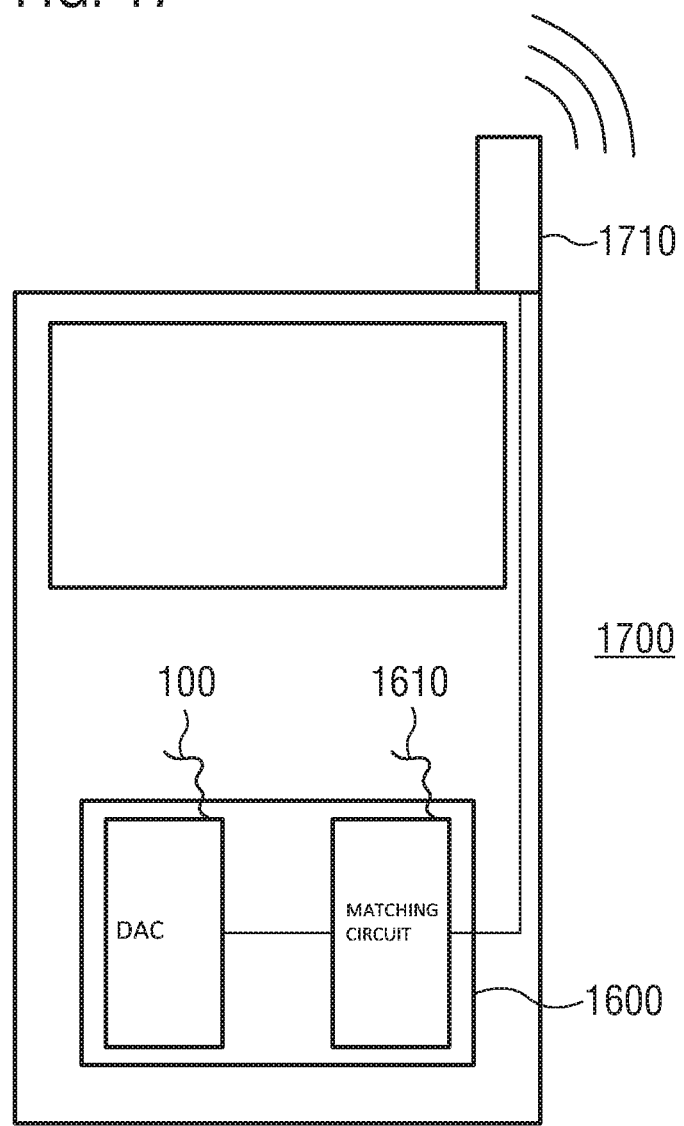
FIG. 17 illustrates an example of a mobile communications device comprising an example of a digital-to-analog converter circuit.

FIG. 17 schematically illustrates an example of a mobile communications device or mobile phone or user equipment 1700 comprising a digital-to-analog converter circuit 100 according to an example described herein. The digital-to-analog converter circuit 100 may be comprised in an apparatus for providing a radio frequency transmit signal 1600 according to an example described herein. The apparatus for providing a radio frequency transmit signal 1600 may further comprise a matching circuit 1610 coupled to the digital-to-analog converter circuit 100. An antenna element 1710 of the mobile communications device 1700 may be coupled to the apparatus for providing a radio frequency transmit signal 1600 to radiate the RF transmit signal into the environment and to wirelessly transmit the signal. To this end, mobile communications devices may be provided having facilitated transmission stages and reduced current consumption.

The mobile communications device may comprise one or more additional optional features corresponding to one or more aspects of the proposed concept or one or more examples described above or below.

Figure 18:
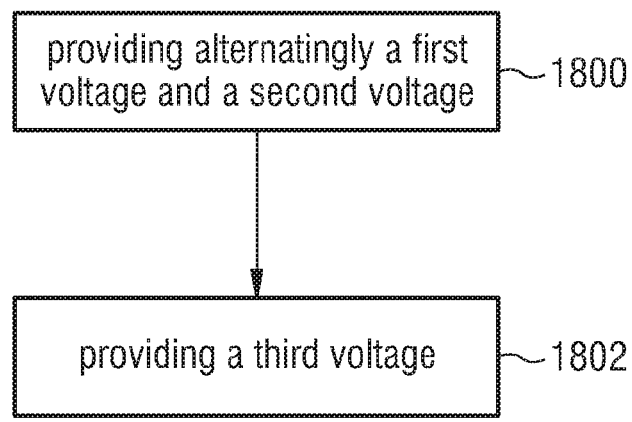
FIG. 18 illustrates a flowchart of an example of a method of digital-to-analog signal conversion.

An example of a method of digital-to-analog signal conversion using a plurality of digital-to-analog converter cells is illustrated by means of a flowchart in FIG. 18. The method comprises providing 1800 alternatingly a first voltage and a second voltage to a first electrode of a capacitive element of a first digital-to-analog converter cell of the plurality of digital-to-analog converter cells based on a digital input signal during a predefined time interval. The method further comprises providing 1802 constantly a third voltage to a first electrode of a capacitive element of a second digital-to-analog converter cell of the plurality of digital-to-analog converter cells during the predefined time interval. The first voltage is higher than an upper threshold voltage corresponding to a first digital level of the digital input signal and the second voltage is lower than a lower threshold voltage corresponding to a second digital level of the digital input signal, wherein the third voltage is lower than the upper threshold voltage and higher than the lower threshold voltage.

More details and aspects of the method are mentioned in connection with the proposed concept or one or more examples described above or below (e.g. FIG. 1-17). The method may comprise one or more additional optional features corresponding to one or more aspects of the proposed concept or one or more examples described above or below.

Figure 19:
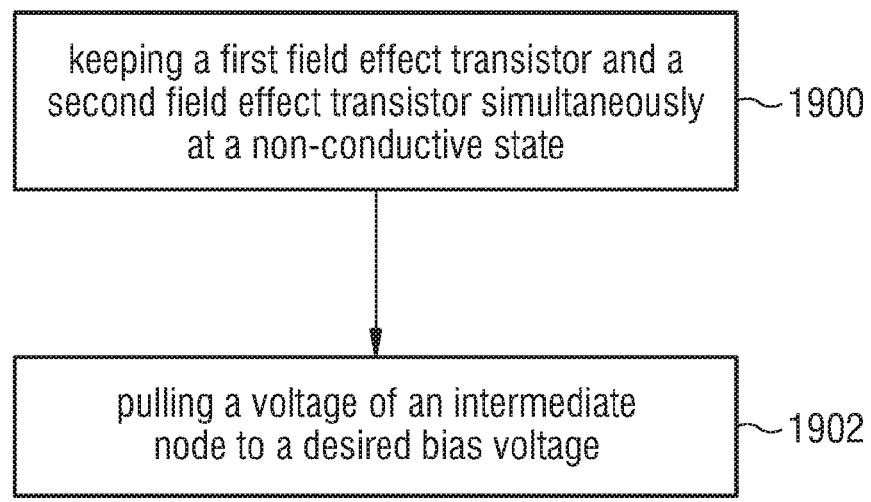
FIG. 19 illustrates a flowchart of an example of another method of digital-to-analog signal conversion.

An example of another method of digital-to-analog signal conversion using a plurality of digital-to-analog converter cells is illustrated by means of a flowchart in FIG. 19. The method comprises keeping 1900 a first field effect transistor and a second field effect transistor simultaneously at a non-conductive state to switch the digital-to-analog converter cell in a tri-state mode, wherein the first field effect transistor and the second field effect transistor are connected to an intermediate node of the cell control module. The method further comprises pulling 1902 a voltage of the intermediate node to a desired bias voltage, if the digital-to-analog converter cell is in the tri-state mode.

More details and aspects of the method are mentioned in connection with the proposed concept or one or more examples described above or below (e.g. FIG. 1-17). The method may comprise one or more additional optional features corresponding to one or more aspects of the proposed concept or one or more examples described above or below.

The examples as described herein may be summarized as follows:

Example 1 is a digital-to-analog converter circuit comprising a plurality of digital-to-analog converter cells comprising: a first digital-to-analog converter cell comprising a cell control module configured to provide alternatingly a first voltage and a second voltage to a first electrode of a capacitive element of the first digital-to-analog converter cell based on a digital input signal during a predefined time interval, wherein the first voltage is higher than an upper threshold voltage corresponding to a first digital threshold level of the digital input signal and the second voltage is lower than a lower threshold voltage corresponding to a second digital threshold level of the digital input signal, and a second digital-to-analog converter cell comprising a cell control module configured to provide a third voltage to a first electrode of a capacitive element of the second digital-to-analog converter cell during the predefined time interval, wherein the third voltage is constantly between the upper threshold voltage and the lower threshold voltage during the predefined time interval.

In example 2, the capacitive element of the first digital-to-analog converter cell comprises a second electrode coupled to a common output node of the digital-to-analog converter circuit, wherein the capacitive element of the second digital-to-analog converter cell comprises a second electrode connected to the common output node of the digital-to-analog converter circuit.

In example 3, the cell control module of the second digital-to-analog converter cell is configured to provide the third voltage based on a digital tri-state control signal indicating an activation of a tri-state mode.

In example 4, the cell control module of the first digital-to-analog converter cell of the digital-to-analog converter circuit of example 1 or example 2 is configured to provide the first voltage based on the digital input signal indicating the first digital level and a digital tri-state control signal indicating a de-activation of a tri-state-mode.

In example 5, the digital input signal is an oscillator signal.

In example 6, a phase of the oscillator signal of example 5 is adapted for different symbol time intervals.

In example 7, a number of digital-to-analog converter cells of the digital-to-analog converter circuit of example 5 or example 6 providing the third voltage being constantly between the upper threshold voltage and the lower threshold voltage to the first electrodes of the respective capacitive element during the predefined time interval is selected based on a frequency of the oscillator signal and/or an output power of the digital-to-analog converter circuit.

In example 8, the oscillator signal of example 5, 6 or 7 comprises a first frequency during a first transmission time interval and a second frequency during a second transmission time interval.

In example 9, a number of digital-to-analog converter cells providing alternatingly the first voltage and the second voltage to the first electrodes of the respective capacitive element during the predefined time interval is selected based on a digital amplitude control signal.

In example 10, a number of digital-to-analog converter cells of the digital-to-analog converter circuit of example 9 providing constantly the first voltage or the second voltage to the first electrodes of the respective capacitive element during the predefined time interval is selected based on the digital amplitude control signal.

In example 11, the cell control module of the first digital-to-analog converter cell comprises an inverter circuit, wherein an output node of the inverter circuit of the first digital-to-analog converter cell is coupled to the first electrode of the capacitive element of the first digital-to-analog converter cell.

In example 12, the inverter circuit of the first digital-to-analog converter cell of the digital-to-analog converter circuit of example 11 comprises at least two field effect transistors coupled to the output node of the inverter circuit of the first digital-to-analog converter cell, wherein the at least two field effect transistors are configured to be switched based on the digital input signal.

In example 13, the cell control module of the first digital-to-analog converter cell of the digital-to-analog converter circuit of example 12 further comprises at least one bias module configured to bias the output node of the inverter circuit of the first digital-to-analog converter cell to the third voltage, if the at least two field effect transistors are simultaneously in a non-conductive state, wherein the bias module has a resistance which is lower than the resistance of each of the at least two field effect transistors of the inverter circuit in the non-conductive state and higher than the resistance of each of the at least two field effect transistors in a conductive state.

In example 14, the bias module of the digital-to-analog converter circuit of example 13 comprises at least one resistor connected between a bias voltage source and the output node of the inverter circuit of the first digital-to-analog converter cell, wherein the at least one resistor has a resistance which is lower than the resistance of each of the at least two field effect transistors of the inverter circuit in the non-conductive state and higher than the resistance of each of the at least two field effect transistors of the inverter circuit in a conductive state.

In example 15, the bias module of the digital-to-analog converter circuit of example 13 comprises at least one field effect transistor connected between a bias voltage source and the output node of the inverter circuit of the first digital-to-analog converter cell, wherein the at least one field effect transistor of the bias module is configured to provide the third voltage, if the at least two field effect transistors of the inverter circuit are simultaneously in the non-conductive state.

In example 16, the bias module of the digital-to-analog converter circuit of example 15 comprises a plurality of serially connected field effect transistors between the bias voltage source and the output node of the inverter circuit of the first digital-to-analog converter cell, wherein the plurality of field effect transistors of the bias module is configured to provide the third voltage, if the at least two field effect transistors of the inverter circuit are simultaneously in the non-conductive state.

In example 17, the first digital-to-analog converter cell is assigned to a first cell row of a plurality of cell rows and a first cell column of a plurality of cell columns, wherein the second digital-to-analog converter cell is assigned to a second cell row of the plurality of cell rows and a second cell column of the plurality of cell columns.

In example 18, the same digital tri-state control signal is provided to all cells of the second cell row of the digital-to-analog converter circuit of example 17 to control a tri-state mode of the digital-to-analog converter cells of the second cell row or to all cells of the second cell column to control a tri-state mode of the digital-to-analog converter cells of the second cell column.

In example 19, the first digital-to-analog converter cell comprises at least one further capacitive element, wherein the cell control module of the first digital-to-analog converter cell is configured to either provide alternatingly the first and the second voltage to a first electrode of the further capacitive element or provide constantly the third voltage to the first electrode of the further capacitive element during the predefined time interval.

In example 20, the second digital-to-analog converter cell of the digital-to-analog converter circuit of example 19 comprises at least one more capacitive element, wherein the cell control module of the second digital-to-analog converter cell is configured to either provide alternatingly the first and the second voltage to a first electrode of the further capacitive element or provide constantly the third voltage to the first electrode of the further capacitive element during the predefined time interval, and wherein a number of capacitive elements provided alternatingly with the first voltage and the second voltage is equal for the first digital-to-analog converter cell and the second digital-to-analog converter cell.

In example 21, two capacitive elements of the capacitive elements of the first digital-to-analog converter cell of the digital-to-analog converter circuit of example 19 or example 20 form a differential capacitive element, wherein the cell control module of the first digital-to-analog converter cell is configured to provide the first voltage to the first electrode of one of the two capacitive elements of the differential capacitive element while providing the second voltage to the other of the two capacitive elements of the differential capacitance element.

Example 22 is an apparatus for providing a radio frequency transmit signal, comprising: at least one digital-to-analog converter circuit according to any of examples 1 to 21 configured to generate an analog radio frequency transmit signal based on a digital baseband transmit signal; and a matching circuit coupled to the digital-to-analog converter circuit, wherein an inductance of the matching circuit presented to the digital-to-analog converter circuit is adjustable.

In example 23, the apparatus for providing a radio frequency transmit signal of example 22 comprises a second digital-to-analog converter circuit according to any of examples 1 to 21, wherein the first digital-to-analog converter circuit is configured to generate an analog radio frequency transmit signal having a carrier frequency within a first frequency range, and wherein the second digital-to-analog converter circuit is configured to generate an analog radio frequency transmit signal having a carrier frequency within a second frequency range.

In example 24, the first frequency range is from 400 MHz to 1200 MHz and the second frequency range is from 1200 MHz to 3800 MHz in the apparatus for providing a radio frequency transmit signal of example 23.

In example 25, the apparatus for providing a radio frequency transmit signal further comprises a power amplifier coupled between the common output node of the digital-to-analog converter circuit and the matching circuit, wherein the power amplifier is configured to amplify the radio frequency transmit signal and provide the amplified radio frequency transmit signal to an antenna element.

Example 26 is a digital-to-analog converter circuit comprising a plurality of digital-to-analog converter cells, wherein a digital-to-analog converter cell of the plurality of digital-to-analog converter cells comprises: a cell control module connected to a gate of a first field effect transistor and a gate of a second field effect transistor, wherein the first field effect transistor and the second field effect transistor are connected to an intermediate node of the digital-to-analog converter cell, wherein the cell control module is configured to keep the first field effect transistor and the second field effect transistor simultaneously at a non-conductive state to switch the digital-to-analog converter cell to a tri-state mode; and a bias module coupled to the intermediate node of the digital-to-analog converter cell, wherein the bias module is configured to pull a voltage of the intermediate node to a desired bias voltage, if the digital-to-analog converter cell is in the tri-state mode.

In example 27, the cell control module of the digital-to-analog converter circuit of example 26 is configured to keep the first field effect transistor and the second field effect transistor at the non-conductive state based on a digital tri-state control signal indicating an activation of the tri-state mode.

In example 28, the bias module of the digital-to-analog converter circuit of example 26 or example 27 comprises at least one resistor connected between a bias voltage source and the intermediate node of the digital-to-analog converter cell, wherein the at least one resistor has a resistance which is lower than the resistance of each of the at least two field effect transistors of the digital-to-analog converter cell in the non-conductive state and higher than the resistance of each of the at least two field effect transistors of the digital-to-analog converter cell in a conductive state.

In example 29, the bias module of the digital-to-analog converter circuit of example 26 or example 27 comprises at least one field effect transistor connected between a bias voltage source and the intermediate node of the digital-to-analog converter cell, wherein the at least one field effect transistor is configured to provide the bias voltage, if the at least two field effect transistors of the digital-to-analog converter cell are simultaneously in the non-conductive state.

In example 30, the bias module of the digital-to-analog converter circuit of example 29 comprises a plurality of serially connected field effect transistors between the bias voltage source and the intermediate node of the digital-to-analog converter cell, wherein the plurality of serially connected field effect transistors is configured to provide the bias voltage, if the at least two field effect transistors of the digital-to-analog converter cell are simultaneously in the non-conductive state.

Example 31 is a transceiver comprising a digital-to-analog converter circuit according to any of examples 1 to 21, an apparatus for providing a radio frequency transmit signal according to any of examples 22 to 25 or a digital-to-analog converter circuit according to any of examples 26 to 30.

Example 32 is a mobile communications device comprising an apparatus for providing a radio frequency transmit signal according to any of examples 22 to 25 or a transceiver according to example 31.

Example 33 is a means for digital-to-analog conversion comprising a plurality of cellular means for digital-to-analog conversion comprising: a first cellular means for digital-to-analog conversion comprising a means for controlling the cell configured to provide alternatingly a first voltage and a second voltage to a first means for accumulation of charges of a means for providing a capacity of the first cellular means for digital-to-analog conversion based on a digital input signal during a predefined time interval, wherein the first voltage is higher than an upper threshold voltage corresponding to a first digital threshold level of the digital input signal and the second voltage is lower than a lower threshold voltage corresponding to a second digital threshold level of the digital input signal, and a second cellular means for digital-to-analog conversion comprising a means for controlling the cell configured to provide a third voltage to a first means for accumulation of charges of a means for providing a capacity of the second cellular means for digital-to-analog conversion during the predefined time interval, wherein the third voltage is constantly between the upper threshold voltage and the lower threshold voltage during the predefined time interval.

In example 33, the means for providing a capacity of the first cellular means for digital-to-analog conversion comprises a second means for accumulation of charges coupled to a common means for providing an output of the means for digital-to-analog conversion, wherein the means for providing a capacity of the second cellular means for digital-to-analog conversion comprises a second means for accumulation of charges connected to the common means for providing an output of the means for digital-to-analog conversion.

Example 35 is a means for digital-to-analog conversion comprising a plurality of cellular means for digital-to-analog conversion, wherein a cellular means for digital-to-analog conversion of the plurality of cellular means for digital-to-analog conversion comprises: a means for controlling connected to a means for switch control of a first means for switching and a means for switch control of a second means for switching, wherein the first means for switching and the second means for switching are connected to a means for providing an intermediate node of the cellular means for digital-to-analog conversion, wherein the means for controlling is configured to keep the first means for switching and the second means for switching simultaneously at a non-conductive state to switch the cellular means for digital-to-analog conversion to a tri-state mode; and a means for biasing coupled to the means for providing an intermediate node, wherein the means for biasing is configured to pull a voltage of the means for providing an intermediate node to a desired bias voltage, if the cellular means for digital-to-analog conversion is in the tri-state mode.

In example 36, the means for controlling of the means for digital-to-analog conversion of example 35 is configured to keep the first means for switching and the second means for switching at the non-conductive state based on a digital tri-state control signal indicating an activation of the tri-state mode.

Example 37 is a method of digital-to-analog conversion using a plurality of digital-to-analog converter cells, comprising: providing alternatingly a first voltage and a second voltage to a first electrode of a capacitive element of a first digital-to-analog converter cell of the plurality of digital-to-analog converter cells based on a digital input signal during a predefined time interval, wherein the first voltage is higher than an upper threshold voltage corresponding to a first digital threshold level of the digital input signal and the second voltage is lower than a lower threshold voltage corresponding to a second digital threshold level of the digital input signal, and providing a third voltage to a first electrode of a capacitive element of a second digital-to-analog converter cell of the plurality of digital-to-analog converter cells during the predefined time interval, wherein the third voltage is constantly between the upper threshold voltage and the lower threshold voltage during the predefined time interval.

In example 38, providing the third voltage is based on a digital tri-state control signal indicating an activation of a tri-state mode in the method of example 37.

In example 39, providing the first voltage is based on the digital input signal indicating the first digital level and a digital tri-state control signal indicating a de-activation of a tri-state-mode in the method of example 37.

In example 40, the digital input signal is an oscillator signal in the methods of any of the preceding examples.

In example 41, a phase of the oscillator signal is adapted for different symbol time intervals in the method of example 40.

In example 42, the method of example 40 or example 41 further comprises selecting a number of digital-to-analog converter cells providing the third voltage being constantly between the upper threshold voltage and the lower threshold voltage to the first electrodes of the respective capacitive element during the predefined time interval based on a frequency of the oscillator signal and/or a combined output power of the plurality of digital-to-analog converter cells.

In example 43, the oscillator signal comprises a first frequency during a first transmission time interval and a second frequency during a second transmission time interval in the method of any of examples 40 to 42.

In example 44, the method further comprises selecting a number of digital-to-analog converter cells providing alternatingly the first voltage and the second voltage to the first electrodes of the respective capacitive element during the predefined time interval based on a digital amplitude control signal.

In example 45, the method of example 44 further comprises selecting a number of digital-to-analog converter cells providing constantly the first voltage or the second voltage to the first electrodes of the respective capacitive element during the predefined time interval based on the digital amplitude control signal.

In example 46, the first digital-to-analog converter cell of the method of any of examples 37 to 45 is assigned to a first cell row of a plurality of cell rows and a first cell column of a plurality of cell columns, wherein the second digital-to-analog converter cell is assigned to a second cell row of the plurality of cell rows and a second cell column of the plurality of cell columns, and wherein the method further comprises: providing the same digital tri-state control signal to all cells of the second cell row to control a tri-state mode of the digital-to-analog converter cells of the second cell row or to all cells of the second cell column to control a tri-state mode of the digital-to-analog converter cells of the second cell column.

In example 47, the first digital-to-analog converter cell of the method of any of the preceding examples comprises at least one further capacitive element, wherein the method further comprises: either providing alternatingly the first and the second voltage to a first electrode of the further capacitive element or providing constantly the third voltage to the first electrode of the further capacitive element during the predefined time interval.

In example 48, the second digital-to-analog converter cell of the method of example 47 comprises at least one more capacitive element, wherein the method further comprises: either providing alternatingly the first and the second voltage to a first electrode of the further capacitive element or providing constantly the third voltage to the first electrode of the further capacitive element during the predefined time interval, and wherein a number of capacitive elements provided alternatingly with the first voltage and the second voltage is equal for the first digital-to-analog converter cell and the second digital-to-analog converter cell.

In example 49, two capacitive elements of the capacitive elements of the first digital-to-analog converter cell of the method of example 47 or example 48 form a differential capacitive element, wherein the method further comprises: providing the first voltage to the first electrode of one of the two capacitive elements of the differential capacitive element while providing the second voltage to the other of the two capacitive elements of the differential capacitance element.

Example 50 is a method of digital-to-analog conversion using a plurality of digital-to-analog converter cells, wherein operating one digital-to-analog converter cell of the plurality of digital-to-analog converter cells comprises keeping a first field effect transistor and a second field effect transistor simultaneously at a non-conductive state to switch the digital-to-analog converter cell in a tri-state mode, wherein the first field effect transistor and the second field effect transistor are connected to an intermediate node of the digital-to-analog converter cell, and pulling a voltage of the intermediate node to a desired bias voltage, if the digital-to-analog converter cell is in the tri-state mode.

Example 51 is a computer readable storage medium having stored thereon a program having a pro-gram code for performing the method of any of examples 37 to 50, when the program is executed on a computer or processor.

Example 52 is a computer program having a program code configured to perform the method of any of examples 37 to 50, when the computer program is executed on a computer or processor.

Examples may further provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . ." (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

What is claimed is:

1. A digital-to-analog converter circuit comprising
a plurality of digital-to-analog converter cells comprising:
a first digital-to-analog converter cell comprising a cell control module configured to provide alternatingly a first voltage and a second voltage to a first electrode of a capacitive element of the first digital-to-analog converter cell based on a digital input signal during a predefined time interval, wherein the first voltage is higher than an upper threshold voltage corresponding to a first digital threshold level of the digital input signal and the second voltage is lower than a lower threshold voltage corresponding to a second digital threshold level of the digital input signal, and
a second digital-to-analog converter cell comprising a cell control module configured to provide a third voltage to a first electrode of a capacitive element of the second digital-to-analog converter cell during the predefined time interval, wherein the third voltage is constantly between the upper threshold voltage and the lower threshold voltage during the predefined time interval.

2. The digital-to-analog converter circuit of claim 1, wherein the capacitive element of the first digital-to-analog converter cell comprises a second electrode coupled to a common output node of the digital-to-analog converter circuit, wherein the capacitive element of the second digital-to-analog converter cell comprises a second electrode connected to the common output node of the digital-to-analog converter circuit.

3. The digital-to-analog converter circuit of claim 1, wherein the cell control module of the second digital-to-analog converter cell is configured to provide the third voltage based on a digital tri-state control signal indicating an activation of a tri-state mode.

4. The digital-to-analog converter circuit of claim 1, wherein the cell control module of the first digital-to-analog converter cell is configured to provide the first voltage based on the digital input signal indicating the first digital level and a digital tri-state control signal indicating a de-activation of a tri-state-mode.

5. The digital-to-analog converter circuit of claim 1, wherein the digital input signal is an oscillator signal.

6. The digital-to-analog converter circuit of claim 5, wherein a phase of the oscillator signal is adapted for different symbol time intervals.

7. The digital-to-analog converter circuit of claim 5, wherein a number of digital-to-analog converter cells providing the third voltage being constantly between the upper threshold voltage and the lower threshold voltage to the first electrodes of the respective capacitive element during the predefined time interval is selected based on a frequency of the oscillator signal and/or an output power of the digital-to-analog converter circuit.

8. The digital-to-analog converter circuit of claim 5, wherein the oscillator signal comprises a first frequency during a first transmission time interval and a second frequency during a second transmission time interval.

9. The digital-to-analog converter circuit of claim 1, wherein a number of digital-to-analog converter cells providing alternatingly the first voltage and the second voltage to the first electrodes of the respective capacitive element during the predefined time interval is selected based on a digital amplitude control signal.

10. The digital-to-analog converter circuit of claim 9, wherein a number of digital-to-analog converter cells providing constantly the first voltage or the second voltage to the first electrodes of the respective capacitive element during the predefined time interval is selected based on the digital amplitude control signal.

11. The digital-to-analog converter circuit of claim 1, wherein the cell control module of the first digital-to-analog converter cell comprises an inverter circuit, and wherein an output node of the inverter circuit of the first digital-to-analog converter cell is coupled to the first electrode of the capacitive element of the first digital-to-analog converter cell.

12. The digital-to-analog converter circuit of claim 11, wherein the inverter circuit of the first digital-to-analog converter cell comprises at least two field effect transistors coupled to the output node of the inverter circuit of the first digital-to-analog converter cell, and wherein the at least two field effect transistors are configured to be switched based on the digital input signal.

13. The digital-to-analog converter circuit of claim 12, wherein the cell control module of the first digital-to-analog converter cell further comprises at least one bias module configured to bias the output node of the inverter circuit of the first digital-to-analog converter cell to the third voltage, if the at least two field effect transistors are simultaneously in a non-conductive state,
wherein the bias module has a resistance which is lower than the resistance of each of the at least two field effect transistors of the inverter circuit in the non-conductive state and higher than the resistance of each of the at least two field effect transistors in a conductive state.

14. The digital-to-analog converter circuit of claim 13, wherein the bias module comprises at least one resistor connected between a bias voltage source and the output node of the inverter circuit of the first digital-to-analog converter cell, and
wherein the at least one resistor has a resistance which is lower than the resistance of each of the at least two field effect transistors of the inverter circuit in the non-conductive state and higher than the resistance of each of the at least two field effect transistors of the inverter circuit in a conductive state.

15. The digital-to-analog converter circuit of claim 13, wherein the bias module comprises at least one field effect transistor connected between a bias voltage source and the output node of the inverter circuit of the first digital-to-analog converter cell, and
wherein the at least one field effect transistor of the bias module is configured to provide the third voltage, if the at least two field effect transistors of the inverter circuit are simultaneously in the non-conductive state.

16. A digital-to-analog converter circuit comprising a plurality of digital-to-analog converter cells, wherein a digital-to-analog converter cell of the plurality of digital-to-analog converter cells comprises:
a cell control module connected to a gate of a first field effect transistor and a gate of a second field effect transistor,
wherein the first field effect transistor and the second field effect transistor are connected to an intermediate node of the digital-to-analog converter cell,
wherein the cell control module is configured to keep the first field effect transistor and the second field effect transistor simultaneously at a non-conductive state to switch the digital-to-analog converter cell to a tri-state mode; and
a bias module coupled to the intermediate node of the digital-to-analog converter cell,
wherein the bias module is configured to pull a voltage of the intermediate node to a desired bias voltage, if the digital-to-analog converter cell is in the tri-state mode.

17. The digital-to-analog converter circuit of claim 16, wherein the cell control module is configured to keep the first field effect transistor and the second field effect transistor at the non-conductive state based on a digital tri-state control signal indicating an activation of the tri-state mode.

18. The digital-to-analog converter circuit of claim 16, wherein the bias module comprises at least one resistor connected between a bias voltage source and the intermediate node of the digital-to-analog converter cell, and
wherein the at least one resistor has a resistance which is lower than the resistance of each of the at least two field effect transistors of the digital-to-analog converter cell in the non-conductive state and higher than the resistance of each of the at least two field effect transistors of the digital-to-analog converter cell in a conductive state.

19. The digital-to-analog converter circuit of claim 16, wherein the bias module comprises at least one field effect transistor connected between a bias voltage source and the intermediate node of the digital-to-analog converter cell, and
wherein the at least one field effect transistor is configured to provide the bias voltage, if the at least two field effect transistors of the digital-to-analog converter cell are simultaneously in the non-conductive state.

20. The digital-to-analog converter circuit of claim 19, wherein the bias module comprises a plurality of serially connected field effect transistors between the bias voltage source and the intermediate node of the digital-to-analog converter cell, and wherein the plurality of serially connected field effect transistors is configured to provide the bias voltage, if the at least two field effect transistors of the digital-to-analog converter cell are simultaneously in the non-conductive state.

21. A method of digital-to-analog conversion using a plurality of digital-to-analog converter cells, comprising:
providing alternatingly a first voltage and a second voltage to a first electrode of a capacitive element of a first digital-to-analog converter cell of the plurality of digital-to-analog converter cells based on a digital input signal during a predefined time interval, wherein the first voltage is higher than an upper threshold voltage corresponding to a first digital threshold level of the digital input signal and the second voltage is lower than a lower threshold voltage corresponding to a second digital threshold level of the digital input signal, and
providing a third voltage to a first electrode of a capacitive element of a second digital-to-analog converter cell of the plurality of digital-to-analog converter cells during the predefined time interval, wherein the third voltage is constantly between the upper threshold voltage and the lower threshold voltage during the predefined time interval.

22. A method of digital-to-analog conversion using a plurality of digital-to-analog converter cells, wherein operating one digital-to-analog converter cell of the plurality of digital-to-analog converter cells comprises:
keeping a first field effect transistor and a second field effect transistor simultaneously at a non-conductive state to switch the digital-to-analog converter cell in a tri-state mode,
wherein the first field effect transistor and the second field effect transistor are connected to an intermediate node of the digital-to-analog converter cell, and
pulling a voltage of the intermediate node to a desired bias voltage, if the digital-to-analog converter cell is in the tri-state mode.

* * * * *